(12) United States Patent
Tsai et al.

(10) Patent No.: US 11,062,998 B2
(45) Date of Patent: Jul. 13, 2021

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chung-Hao Tsai, Changhua County (TW); Chen-Hua Yu, Hsinchu (TW); Chuei-Tang Wang, Taichung (TW); Wei-Ting Chen, Tainan (TW); Chien-Hsun Chen, Pingtung County (TW); Shih-Ya Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/547,567

(22) Filed: Aug. 22, 2019

(65) Prior Publication Data

US 2021/0057346 A1 Feb. 25, 2021

(51) Int. Cl.
*H01L 23/538* (2006.01)
*H01L 25/065* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/367* (2013.01); *H01L 23/5381* (2013.01); *H01L 23/5383* (2013.01); *H01L 23/5386* (2013.01); *H01L 24/19* (2013.01); *H01L 24/20* (2013.01); *H01L 24/96* (2013.01); *H01L 25/0652* (2013.01); *H01L 25/0655* (2013.01); *H01L 25/50* (2013.01);
(Continued)

(58) Field of Classification Search
CPC ............ H01L 23/5389; H01L 23/5381; H01L 23/5383; H01L 23/3128; H01L 23/367; H01L 23/5386; H01L 21/6835; H01L 21/4853; H01L 21/568; H01L 21/565; H01L 21/4857; H01L 25/0655; H01L 25/50; H01L 25/0652; H01L 24/20; H01L 24/19; H01L 24/96; H01L 2221/68372; H01L 2224/95001; H01L 2224/214; H01L 21/561; H01L 2224/023
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Jasmine J Clark
(74) *Attorney, Agent, or Firm* — JCIPRNET

(57) ABSTRACT

A semiconductor package includes dies, a redistribution structure, a conductive structure and connectors. The conductive plate is electrically connected to contact pads of at least two dies and is disposed on redistribution structure. The conductive structure includes a conductive plate and a solder cover, and the conductive structure extend over the at least two dies. The connectors are disposed on the redistribution structure, and at least one connector includes a conductive pillar. The conductive plate is at same level height as conductive pillar. The vertical projection of the conductive plate falls on spans of the at least two dies.

20 Claims, 22 Drawing Sheets

(51) Int. Cl.
*H01L 23/00* (2006.01)
*H01L 23/31* (2006.01)
*H01L 23/367* (2006.01)
*H01L 21/48* (2006.01)
*H01L 21/56* (2006.01)
*H01L 21/683* (2006.01)
*H01L 25/00* (2006.01)

(52) U.S. Cl.
CPC ............... *H01L 2221/68372* (2013.01); *H01L 2224/214* (2013.01); *H01L 2224/95001* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0317029 A1* | 11/2017 | Hsieh .................... H01L 25/105 |
| 2019/0139925 A1* | 5/2019 | Yu .......................... H01L 24/24 |

* cited by examiner

SEMICONDUCTOR PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
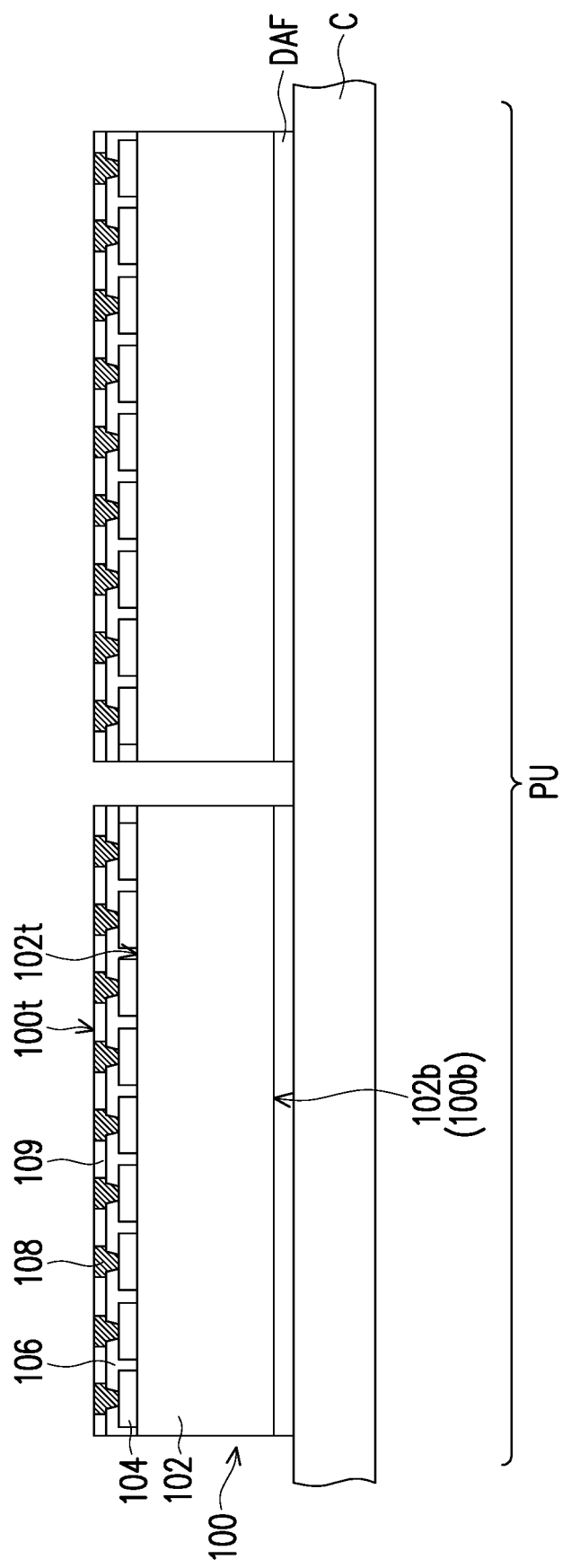
FIG. 1A to FIG. 1H are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating structures produced during a manufacturing process of a semiconductor package 10 (shown in FIG. 1H) in accordance with some embodiments of the disclosure. Referring to FIG. 1A, a carrier C may be provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) may be formed over the carrier C. In some embodiments, the de-bonding layer includes a light-to-heat conversion (LTHC) release layer, which facilitates peeling the carrier C away from the semiconductor device when required by the manufacturing process.

In some embodiments, referring to FIG. 1A, semiconductor dies 100 are provided on the carrier C. In some embodiments, the semiconductor dies 100 are placed onto the carrier C through a pick-and-place method. Even though only two semiconductor dies 100 are presented in FIG. 1A for illustrative purposes, it is understood that a semiconductor package according to some embodiments of the disclosure may contain more than two semiconductor dies 100. Furthermore, a plurality of semiconductor dies may be provided on the carrier C to produce multiple package units PU with wafer-level packaging technology.

In some embodiments, an individual semiconductor die 100 includes a semiconductor substrate 102, a plurality of contact pads 104 and a passivation layer 106. The contact pads 104 may be formed on a top surface 102t of the semiconductor substrate 102. The passivation layer 106 may cover the top surface 102t and have a plurality of openings that exposes at least a portion of each contact pad 104. In some embodiments, a semiconductor die 100 further includes a plurality of conductive posts 108 filling the openings of the passivation layer 106 and electrically connected to the contact pads 104, and a protective layer 109 surrounding the conductive posts 108. In some embodiments, the conductive posts 108 are exposed by the protective layer 109. In some alternative embodiments, the conductive posts 108 are covered by the protective layer 109.

In some embodiments, the semiconductor dies 100 are placed on the carrier C with an active surface 100t of each semiconductor die 100 facing away from the carrier C. A backside surface 100b of the semiconductor die 100 may coincide with a bottom surface 102b of the semiconductor substrate 102. In some embodiments, the semiconductor dies 100 are disposed with the bottom surfaces 102b facing the carrier C. Portions of die attach film DAF may be disposed on the bottom surfaces 102b, to secure the semiconductor dies 100 to the carrier C. In some embodiments, the die attach film DAF includes a pressure adhesive, a thermally curable adhesive, or the like.

In some embodiments, the semiconductor substrate 102 shown may be made of semiconductor materials, such as semiconductor materials of the groups III-V of the periodic table. In some embodiments, the semiconductor substrate 102 includes elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor substrate 102 includes active components (e.g., transistors or the like) and optionally passive components (e.g., resistors, capacitors, inductors, or the like) formed therein.

In certain embodiments, the contact pads 104 include aluminum pads, copper pads, or other suitable metal pads. In some embodiments, the passivation layer 106 may be a single layer or a multi-layered structure, including a silicon oxide layer, a silicon nitride layer, a silicon oxy-nitride layer, a dielectric layer formed by other suitable dielectric materials or combinations thereof. In some embodiments, the material of the conductive posts 108 includes copper, copper alloys, or other conductive materials, and may be formed by deposition, plating, or other suitable techniques. In some embodiments, the semiconductor dies of the present disclosure may share similar features as the ones just described for the semiconductor die 100.

Referring to FIG. 1A, each of the semiconductor dies 100 included in a package unit PU may independently be or include a logic die, such as a central processing unit (CPU) die, a graphic processing unit (GPU) die, a micro control unit (MCU) die, an input-output (I/O) die, a baseband (BB) die, a field-programmable gate array (FPGA), an application processor (AP) die, or the like. In some embodiments, the semiconductor dies 100, either one or both, include a memory die such as a high bandwidth memory die. For example, each of the semiconductor dies 100 may independently be a dynamic random access memory (DRAM), a resistive random access memory (RRAM), a static random access memory (SRAM), or the like. In some embodiments, one or both of the semiconductor dies 100 may be a die stack. In some embodiments, the semiconductor dies 100 are the same type of dies or perform the same functions. In some embodiments, the semiconductor dies 100 are different types of dies or perform different functions. The disclosure is not limited by the type of dies used for the semiconductor dies 100 within a package unit PU.

Figure 1B:
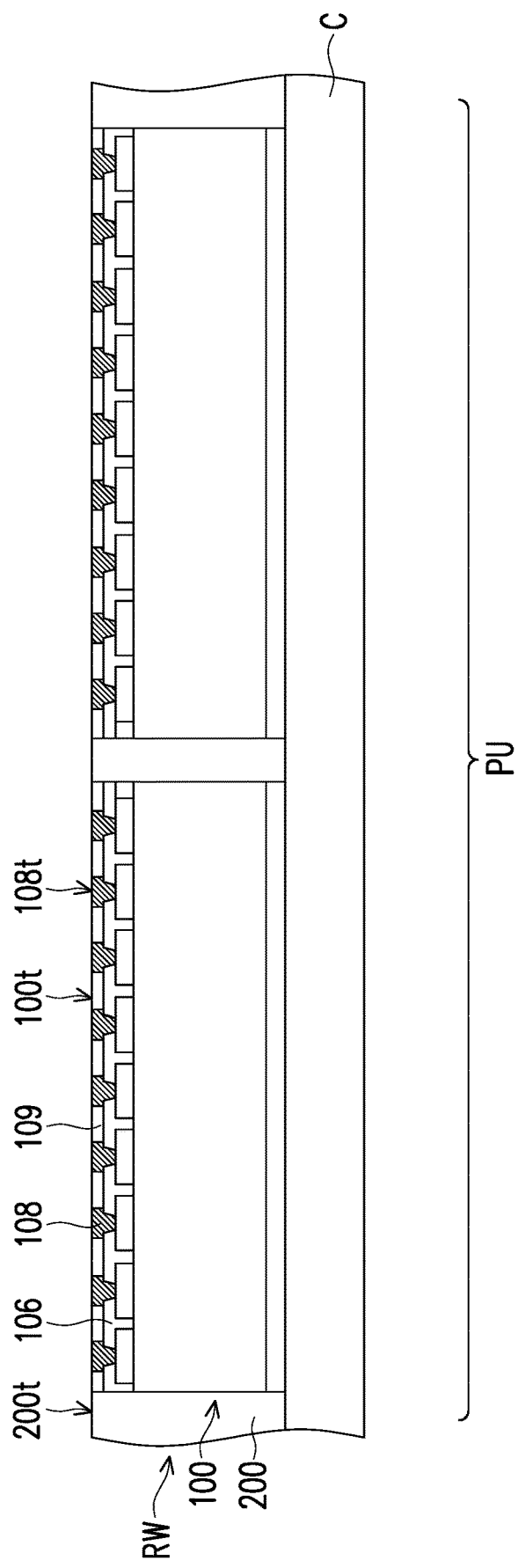

Referring to FIG. 1B, an encapsulant 200 is formed over the carrier C to encapsulate the semiconductor dies 100. In some embodiments, a material of the encapsulant 200 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant 200 further includes fillers. The encapsulant 200 may be formed by a sequence of over-molding and planarization steps. For example, the encapsulant 200 may be originally formed by a molding process (such as a compression molding process) or a spin-coating process so as to completely cover the semiconductor dies 100. In some embodiments, the planarization of the encapsulant 200 includes performing a mechanical grinding process and/or a chemical mechanical polishing (CMP) process. In some embodiments, the planarization process is performed until the conductive posts 108 of the semiconductor dies 100 are exposed. In some embodiments, portions of the passivation layer 109 and the conductive posts 108 may also be removed during the thinning or planarization process of the encapsulant 200. In some embodiments, following the planarization process and the thinning process (if performed), the active surfaces 100t of the semiconductor dies 100 (of which the top surfaces 108t of the conductive posts 108 are part) and the top surface 200t of the encapsulant 200 may be substantially at a same level height (be substantially coplanar). In some embodiments, the top surfaces 108t of the conductive posts 108 slightly protrude with respect to the level defined by the top surface 200t of the encapsulant 200. As illustrated in FIG. 1B, the encapsulant 200 laterally encapsulates the semiconductor dies 100 and the portions of die attach film DAF. With the formation of the encapsulant 200, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1B, a single package unit PU is shown for simplicity but, of course, this is for illustrative purposes only, and the disclosure is not limited by the number of package units PU being produced in the reconstructed wafer RW.

Figure 1C:
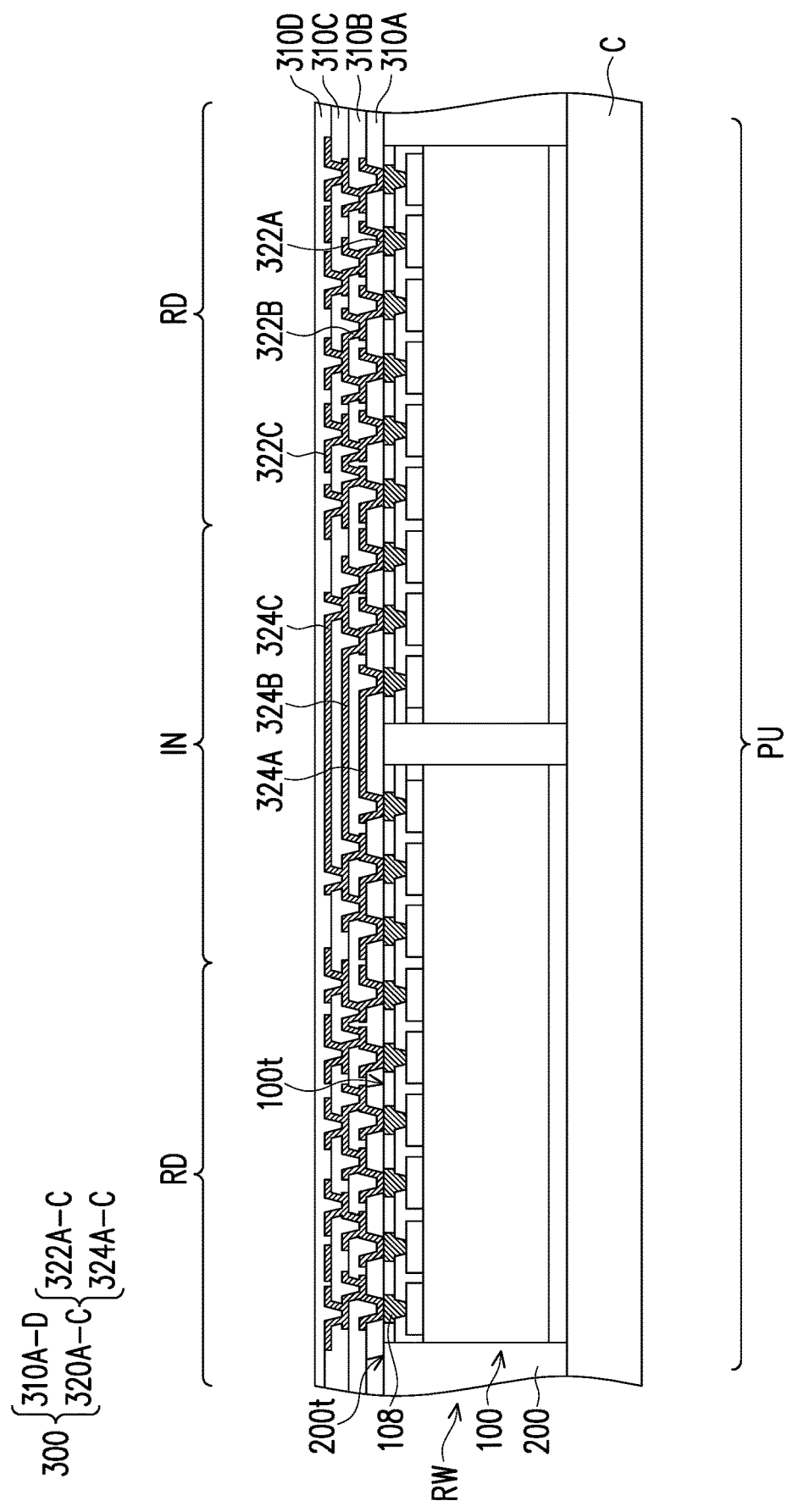

In some embodiments, referring to FIG. 1C, a redistribution structure 300 is formed over the semiconductor dies 100 and the encapsulant 200. In some embodiments, the redistribution structure 300 includes stacked dielectric layers 310A-D and redistribution conductive layers 320 interspersed in the stacked dielectric layer 310A-D. The redistribution conductive layers 320 include redistribution patterns 322A-C and interconnection patterns 324A-C. In the present disclosure, labels "A" to "D" for the stacked dielectric layers 310 and the redistribution conductive layers 320 are used to indicate the distance from the semiconductor dies 100, with elements labeled "A" being closer to the semiconductor dies 100, and elements "B", "C" and "D" being disposed at increasing distance from the semiconductor dies 100. For example, the dielectric layer 310A would be the dielectric layer closer to the semiconductor dies 100 amongst the dielectric layers 310A-D, and the dielectric layer 310D may be the dielectric layer further away from the semiconductor dies 100 amongst the dielectric layers 310A-D. In some embodiments, the dielectric layer 310A is referred to as a bottommost (innermost) dielectric layer 310A, and the dielectric layer 310D is referred to as a topmost (outermost) dielectric layer 310D. A similar nomenclature may be used for the interconnection patterns 324A-C and the redistribution patterns 322A-C. Portions of the redistribution conductive layers 320 may extend through the dielectric layers 310A-D to establish electrical connection with other overlying or underlying redistribution conductive layers 320. In some embodiments, the bottommost redistribution patterns 322A and interconnection patterns 324A extend mostly on the bottommost dielectric layer 310A. Portions of the bottommost redistribution patterns 322A and interconnection patterns 324A penetrate through the bottommost dielectric layer 310A to contact the conductive posts 108 and establish electrical connection with the semiconductor dies 100. In FIG. 1C the redistribution structure 300 is shown to include four dielectric layers 310A-D and three redistribution conductive layers 320 for illustrative purpose only, without limiting the disclosure. In some embodiments, more or fewer dielectric layers or redistribution conductive layers may be included. In some embodiments, the number of redistribution conductive layers and the number of dielectric layers can be varied based on the circuit design.

In some embodiments, the interconnection patterns 324A-C are used to establish electrical connection between semiconductor dies 100 in the same package unit PU, whilst the redistribution patterns 322A-C may be used to provide electrical connection between the semiconductor dies 100 and other components of the package unit or external devices (not shown). For example, the redistribution patterns 322A-C provide electrical connection between the semiconductor dies 100 and later formed connectors. In some embodiments, the region of the redistribution structure in which the interconnection patterns 324A-C extend is referred to as interconnect region IN. In some embodiments, a line density in the interconnection region IN may be higher than a line density outside the interconnection region IN. For example, a line over space ratio for the interconnection patterns 324A-C in the interconnection region IN may be about 2/2 micrometers, whilst a line over space ratio for the redistribution patterns 322A-C may be 5/5 micrometers or 10/10 micrometers. In some embodiments, the redistribution patterns 324A-C may be mostly located in a redistribution region RD disposed beside the interconnection region IN. In some embodiments, the redistribution region RD has an annular shape surrounding the interconnection region IN. In some embodiments, the redistribution patterns 322A-C may partially extend within the interconnection region IN.

In some embodiments, a material of the redistribution conductive layers 320 includes aluminum, titanium, copper, nickel, tungsten, combinations thereof, or other suitable conductive materials. The redistribution conductive layers 320 may be formed by, for example, electroplating, deposition, and/or photolithography and etching. In some embodiments, the material of the dielectric layers 310A-D includes polyimide, epoxy resin, acrylic resin, phenol resin, benzocyclobutene (BCB), polybenzoxazole (PBO), or any other suitable polymer-based dielectric material. The dielectric layers 310A-D, for example, may be formed by suitable fabrication techniques such as spin-on coating, chemical vapor deposition (CVD), plasma-enhanced chemical vapor deposition (PECVD), or the like.

Figure 1D:
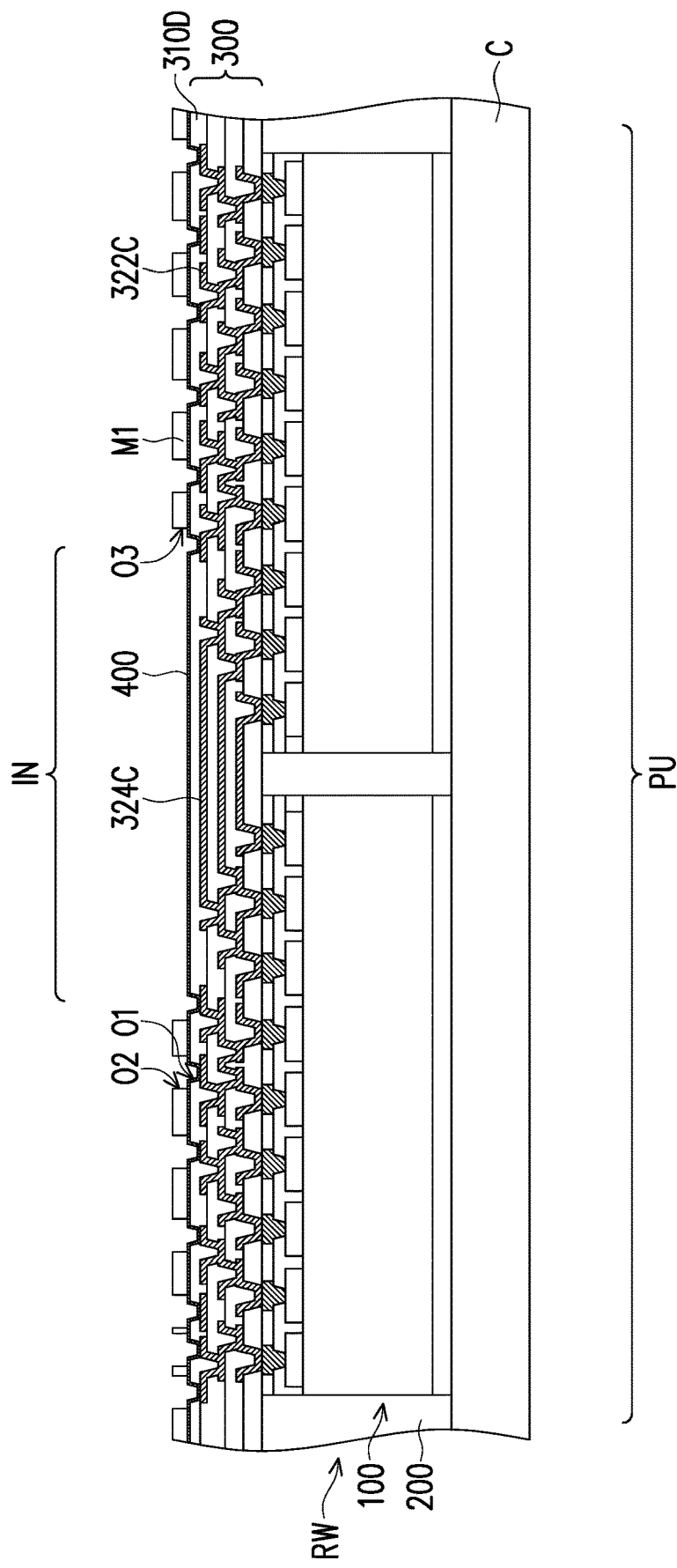

Referring to FIG. 1D, in some embodiments, openings O1 are formed in the topmost dielectric layer 310D exposing portions of the topmost redistribution patterns 322C. In some embodiments, the openings O1 are formed in the region of the package unit PU surrounding the interconnect region IN. In some embodiments, the topmost interconnection patterns 324C are covered by the topmost dielectric layer 310D, without being exposed by the openings O1. A seed material layer 400 may be formed covering the openings O1 and the topmost dielectric layer 310D. In some embodiments, the seed material layer 400 is blanketly formed over the package unit PU. As illustrated in FIG. 1D, the seed material layer 400 is formed in a conformal manner covering the profile of the openings O1. That is, the seed material layer 400 extends into the openings O1 to cover bottom surfaces and sidewalls of the openings O1. In some embodiments, the seed material layer 400 establishes electrical contact with the redistribution pattern 322C at the bottom of the openings O1. The seed material layer 400 may be formed through, for example, a sputtering process, a physical vapor deposition (PVD) process, or the like. In some embodiments, the seed material layer 400 may include, for example, copper, tantalum, titanium, a combination thereof, or other suitable materials. In some embodiments, a barrier layer (not shown) may be deposited before forming the seed material layer 400 to prevent out-diffusion of the material of the seed material layer 400.

An auxiliary mask M1 may be provided over the redistribution structure 300 and the seed material layer 400. In some embodiments, the auxiliary mask M1 is patterned so as to cover only part of the seed material layer 400. The auxiliary mask M1 includes openings O2 and O3 through which portions of the seed material layer 400 are exposed. In some embodiments, the openings O2 encompass the openings O1 of the topmost dielectric layer 310D. That is, the openings O2 are aligned with the openings O1, exposing the openings O1 and portions of the seed material layer 400 disposed on the topmost dielectric material layer 300 immediately surrounding the openings O1. The openings O2 may surround the opening O3. The opening O3 is larger than individual openings O2. The opening O3 may expose the portion of the seed material layer 400 extending in the interconnection region IN and a portion of the seed material layer 400 surrounding the interconnection region IN. In some embodiments, the opening O3 encompasses some (at least two) of the openings O1 of the topmost dielectric layer 310D. In some embodiments, some of the redistribution patterns 322C exposed by one of the openings O1 encompassed by the opening O3 are connected to one of the semiconductor dies 100, and some other redistribution patterns 322C exposed by another one of the openings O1 encompassed by the opening O3 are connected to another one of the semiconductor dies 100. In some embodiments, the auxiliary mask M1 is produced on the carrier C by a sequence of deposition, photolithography and etching. A material of the auxiliary mask M1 may include a positive photoresist or a negative photoresist.

Figure 1E:
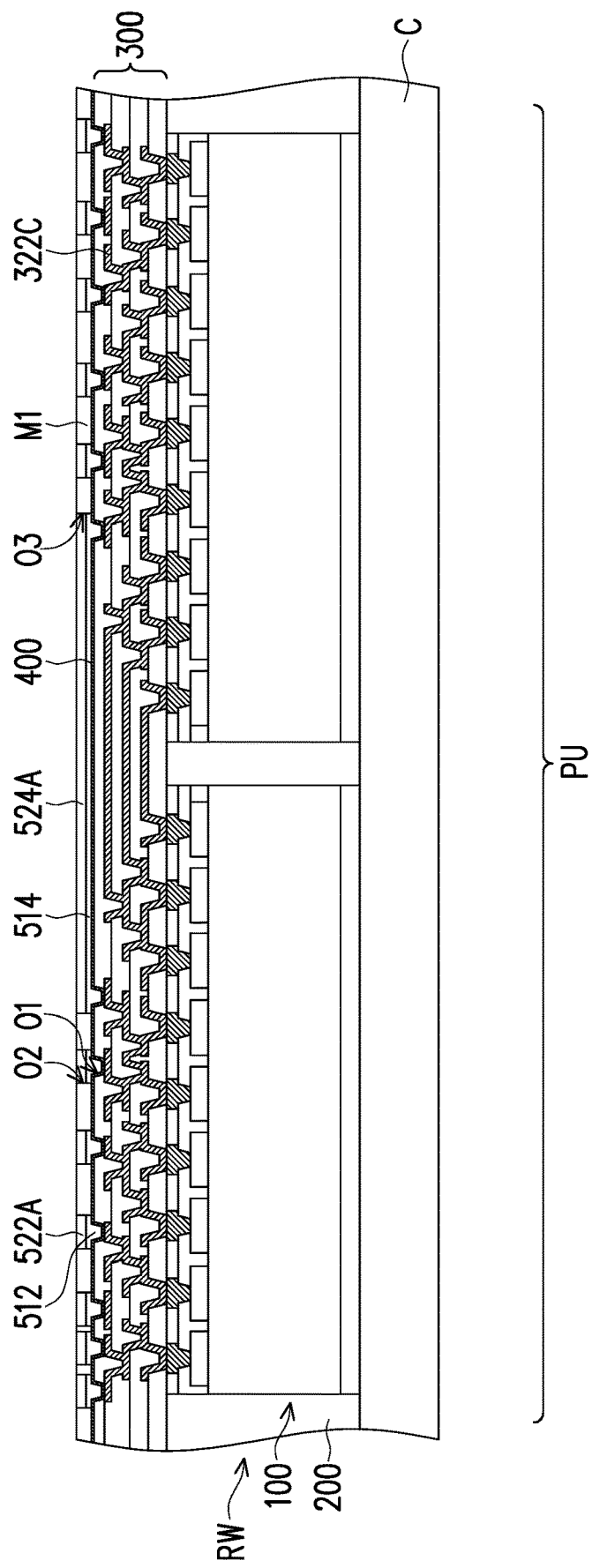

Referring to FIG. 1D and FIG. 1E, in some embodiments, portions 512 and 514 of conductive material may be formed over the seed material layer 400 in the openings O2 and O3, respectively. In some embodiments, the portions of conductive material formed in the openings O2 may form conductive pillars 512 filling the openings O1 of the dielectric layer 310D and at least partially filling the openings O2 of the auxiliary mask M1. In some embodiments, the portion of conductive material disposed in the opening O3 may form a conductive plate 514 covering the interconnection region IN of the redistribution structure 300. In some embodiments, the conductive material may include copper, nickel, tin, palladium, gold, titanium, aluminum, or alloys thereof. In some embodiments, multiple layers of conductive material may be stacked to form the conductive pillars 512 and the conductive plate 514. In some embodiments, the conductive pillars 512 and the conductive plate 514 may be formed by a plating process. The plating process is, for example, electro-plating, electroless-plating, immersion plating, or the like. In some embodiments, solder material 522A is disposed over the conductive pillars 512. In some embodiments, solder material 524A is optionally disposed on the conductive plate 514. In some embodiments, the solder material 522A, 524A includes eutectic solder containing lead or lead-free. In some embodiments, the solder material 522A, 524A includes non-eutectic solder. In some embodiments, the solder material contains Sn, SnAg, SnPb, SnAgCu, SnAgZn, SnZn, SnBiIn, SnIn, SnAu, SnCu, SnZnIn, SnAgSb, or similar soldering alloys. In some embodiments, the solder material is applied as a solder paste.

Figure 1F:
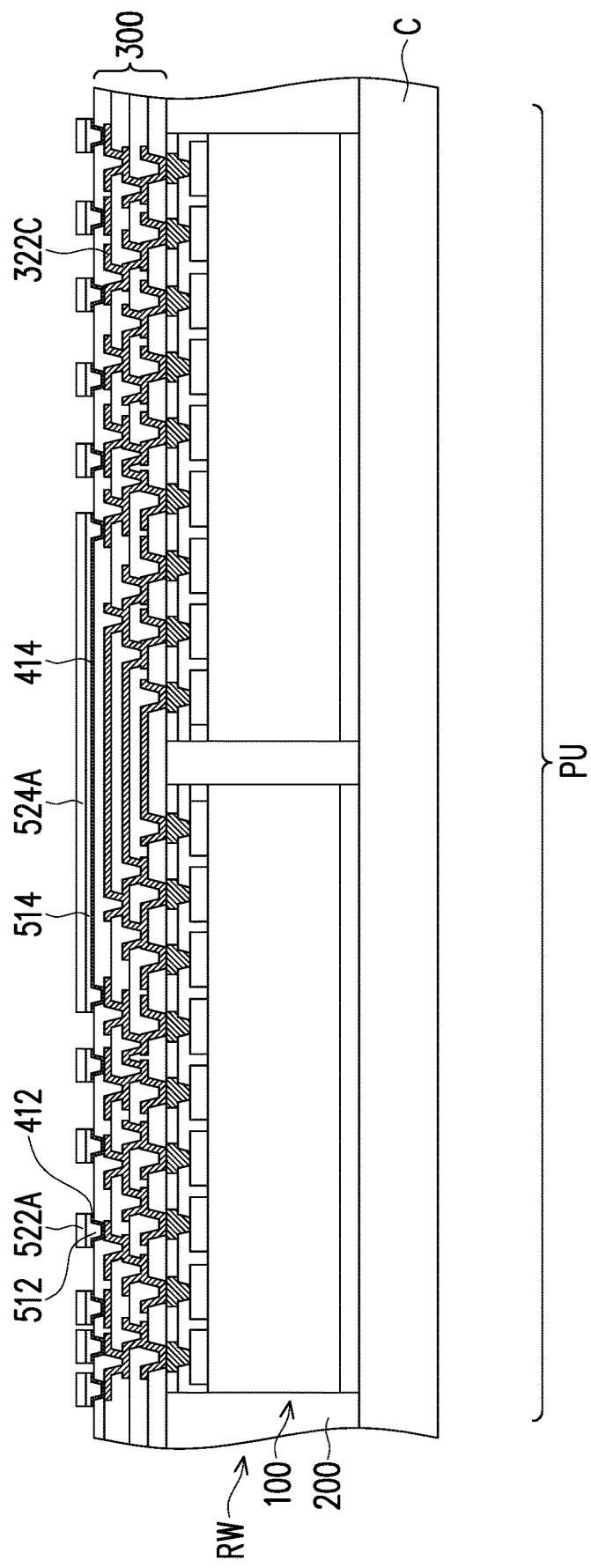
Figure 1G:
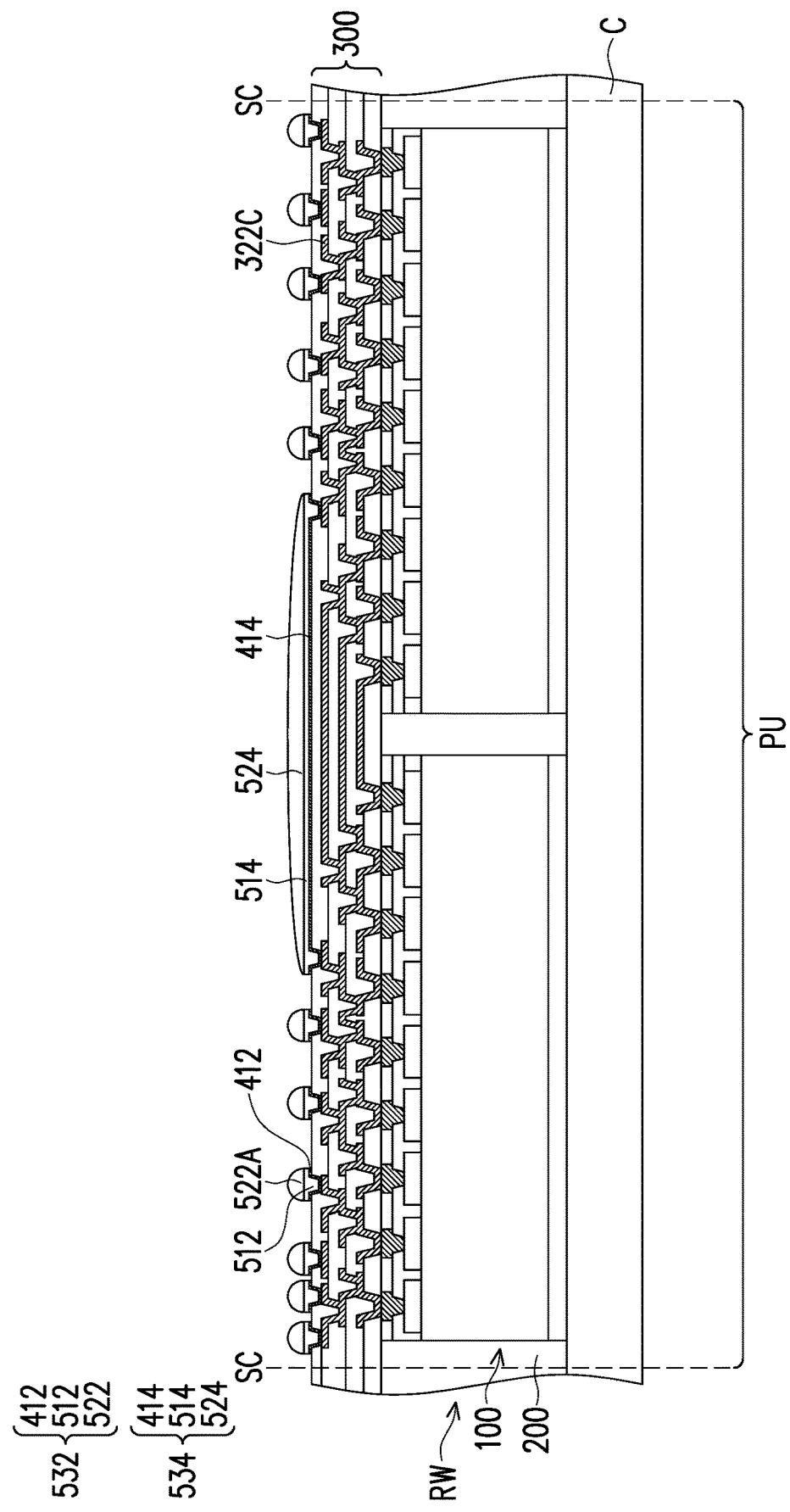

Referring to FIG. 1E and FIG. 1F, the auxiliary mask M1 and the underlying portions of seed material layer 400 may be removed. In some embodiments, the auxiliary mask M1 may be removed or stripped through, for example, etching, ashing, or other suitable removal processes. Upon removal of the auxiliary mask M1, the portions of seed material layer 400 that are not covered by the conductive pillars 512, the conductive plate 514 and the solder material 522A, 524A are removed to render under-bump seed layers 412 disposed between the redistribution structure 300 and the conductive pillars 512, and a seed plate 414 disposed between the redistribution structure 300 and the conductive plate 514. The exposed portions of the seed material layer 400 may be removed through an etching process. In some embodiments, the material of the conductive pillars 512, the conductive plate 514 and the solder material 522A, 524A may be different from the material of the seed material layer 400, so the portions of the seed material layer 400 exposed after removal of the auxiliary mask M1 may be removed through selective etching. Referring to FIG. 1F and FIG. 1G, a reflow process may be performed to form solder bumps 522 on top of the conductive pillar 512, and a solder cover 524 on top of the conductive plate 514. The reflow process may result in the solder bumps 522 and the solder cover 524 having a round profile. In some embodiments, a first portion of the interconnection patterns 322A-C establishes electrical connection between the semiconductor dies 100, the conductive pillars 512 and the solder bumps 524. A second portion of the interconnection patterns 322A-C establishes electrical connection between the semiconductor dies 100, the conductive plate 514 and the solder cover 524. A stack of an under-bump seed layer 412, a conductive pillar 512 and a solder bump 522 may be collectively referred to as a connector 532. A stack of the seed plate 414, the conductive plate 514 and the solder cover 524 may be collectively referred to as a conductive structure 534.

Figure 1H:
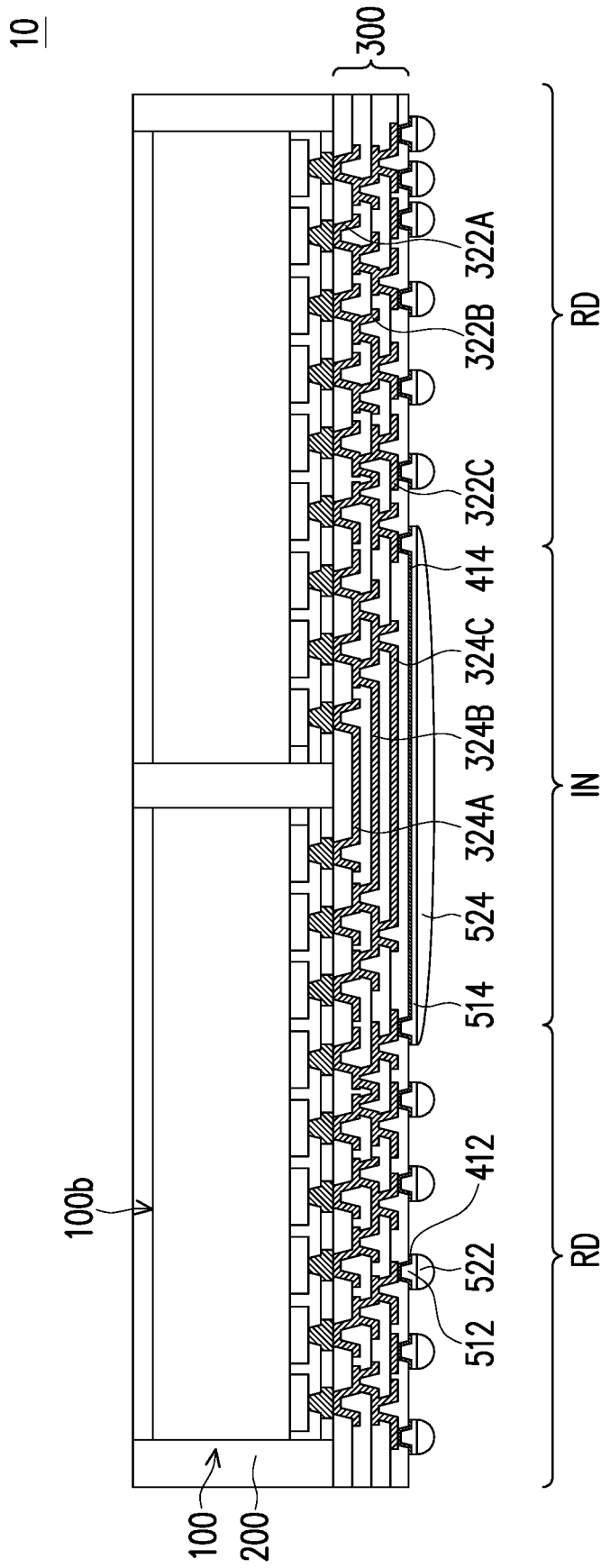

In some embodiments, referring to FIGS. 1G and 1H, a singulation step is performed to separate the individual semiconductor packages 10, for example, by cutting through the reconstructed wafer RW along the scribe lanes SC arranged between individual package units PU. In some embodiments, adjacent semiconductor packages 10 may be separated by cutting through the scribe lanes SC of the reconstructed wafer RW. In some embodiments, the singulation process typically involves performing a wafer dicing process with a rotating blade and/or a laser beam. In some embodiments, the carrier C is separated from the semiconductor packages 10 following singulation. If the de-bonding layer (e.g., the LTHC release layer) is included, the de-bonding layer may be irradiated with a UV laser so that the carrier C and the de-bonding layer are easily peeled off from the semiconductor packages 10. Nevertheless, the de-bonding process is not limited thereto, and other suitable de-bonding methods may be used in some alternative embodiments.

After the singulation step and removal of the carrier C, a plurality of semiconductor packages 10 are obtained. An exemplary cross-sectional view of the semiconductor package 10 according to some embodiments of the disclosure is illustrated in FIG. 1H. Based on the above, a semiconductor package 10 includes semiconductor dies 100 wrapped on the sides by an encapsulant 200 and electrically connected to a redistribution structure 300. In some embodiments, the die attach film DAF may be retained on the backside surfaces 100b of the semiconductor dies 100. In some alternative embodiments, the die attach film DAF may be removed, for example, via a grinding process. In some embodiments, the redistribution structure 300 has an interconnection region IN in which interconnection patterns 324A-C establishing electrical connection between the semiconductor dies 100 are disposed. The redistribution structure 300 may further have a redistribution region RD surrounding the interconnection region IN. In the redistribution region RD, redistribution patterns 322A-C may establish electrical connection between the semiconductor dies 100 and the conductive pillars 512 formed on an opposite side of the redistribution structure 300 with respect to the semiconductor dies 100 and the encapsulant 200. While the redistribution patterns 322A-C may extend mostly through the redistribution region RD, it is also possible for some redistribution patterns 322A-C to extend within the interconnection region IN, depending on the circuit design. A portion of the redistribution patterns 322A-C electrically connects the semiconductor dies 100 with the conductive plate 514. In some embodiments, the redistribution patterns 322A-C contacts the conductive plate 514 along a peripheral edge of the conductive plate 514. A central portion of the conductive plate 514 may overlie the interconnection patterns 324A-C without directly contacting the interconnection patterns 324A-C. The conductive plate 514 is disposed over the redistribution structure 300 between the conductive pillars 512, and provides an additional interconnection route between the two semiconductor dies 100. The conductive plate 514 may be disposed on the outermost dielectric layer 310D of the redistribution structure 300, covering the interconnection region IN. In some embodiments, the conductive plate 514 may further extend into the redistribution region RD. In some embodiments, the seed plate 414 is optionally disposed between the conductive plate 514 and the outermost dielectric layer 310D. In some embodiments, the conductive plate 514 may improve the communication between the semiconductor dies 100. For example, a signal transmitted by a first one of the two semiconductor dies 100 may be reproduced in the second semiconductor die 100 with greater fidelity. In some embodiments, inclusion of the conductive plate 514 results in an increase of the transmission data rate between the semiconductor dies 100. In some embodiments, the conductive plate 514 may act as a ground plane for the redistribution structure 300. In some embodiments, the conductive plate 514 may be used to power the semiconductor dies 100. In some embodiments, the solder cover 524 may further enhance the connection between the two semiconductor dies 100, and may protect the underlying conductive plate 514. In some embodiments, the conductive plate 514 and the solder cover 524 may be fabricated together with the conductive pillars 512 and the solder bumps 522, without additional manufacturing steps. Therefore, the performances of the semiconductor package 10 may be increased with no significant increase of manufacturing costs or process complexity. In some embodiments, the conductive pillars 512 and the solder bumps 522 may be used to integrate the semiconductor package 10 into larger electronic devices (not shown).

Figure 1I:
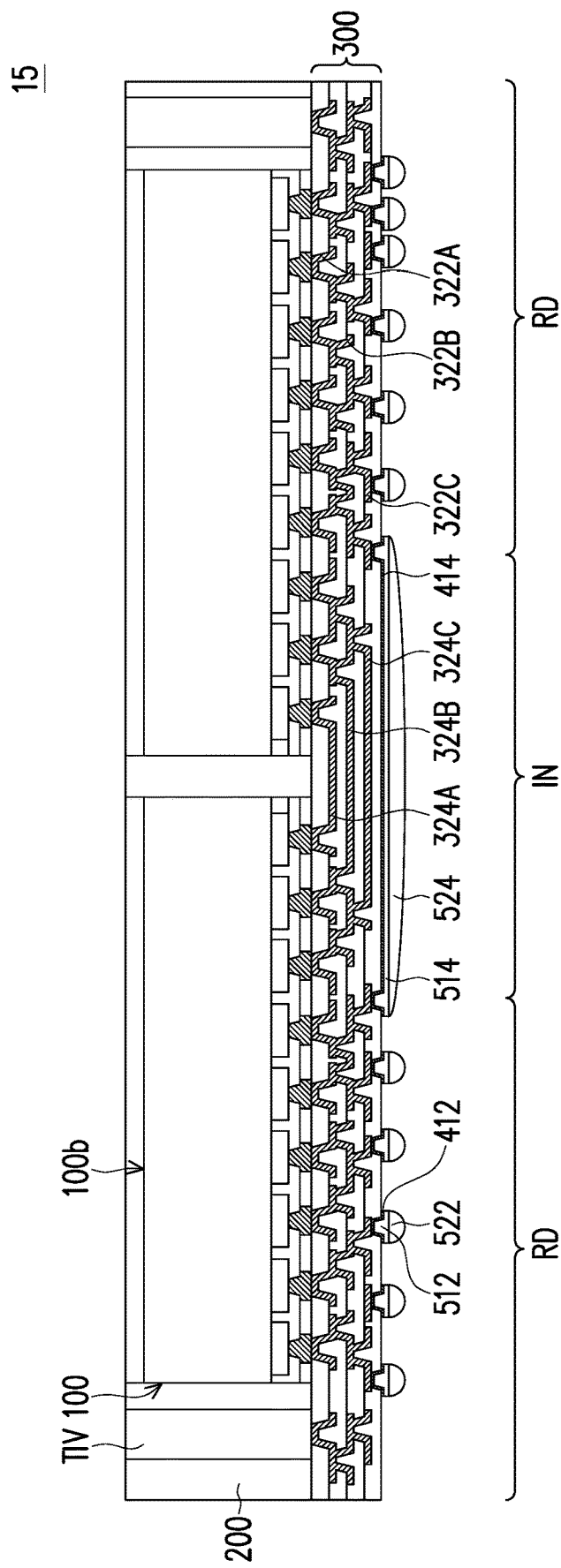
FIG. 1I is a schematic cross-sectional view illustrating a semiconductor package in accordance with some embodiments of the disclosure.

FIG. 1I is a schematic cross-sectional view illustrating a semiconductor package 15 according to some embodiments of the disclosure. The semiconductor package 15 of FIG. 1I may be similar to the semiconductor package 10 of FIG. 1H, and the same or similar reference numbers are used to refer to the same or similar components. In some embodiments, the semiconductor package 15 includes through interconnect vias TIV disposed beside the semiconductor dies 100 and extending through the encapsulant 200. The redistribution patterns 322A-C may establish electrical connection between the semiconductor dies 100 and the through interconnect vias TIV. In some embodiments, the through interconnect vias TIV may be used to provide dual side vertical connection for integration with other devices (not shown).

Figure 1J:
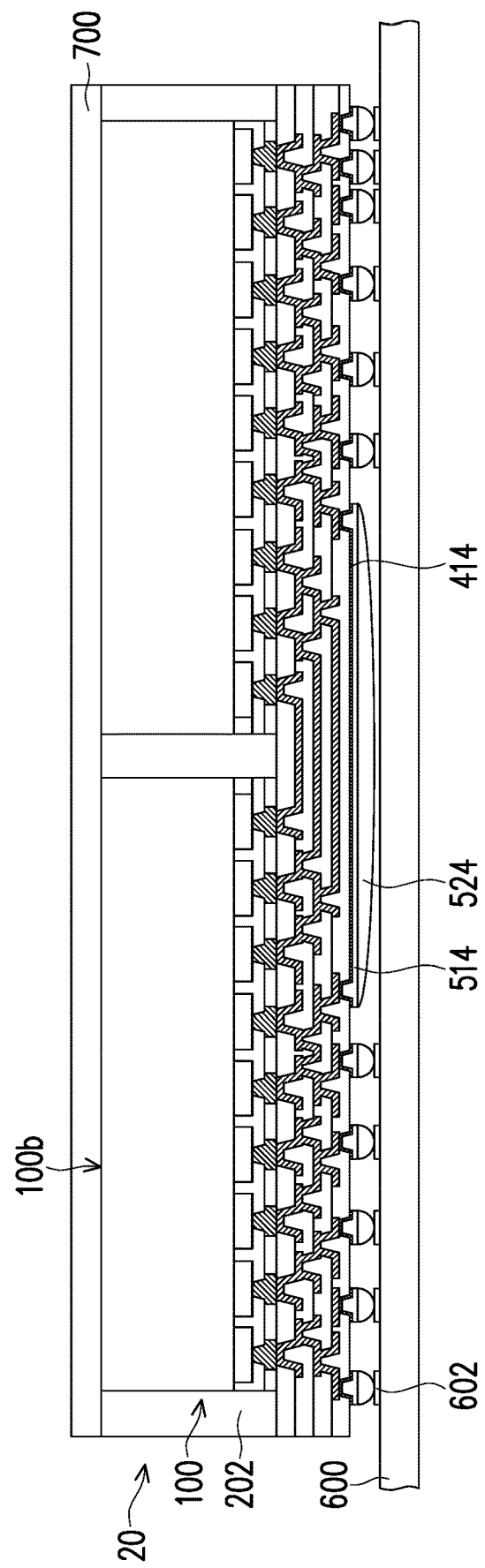
FIG. 1J and FIG. 1K are schematic cross-sectional views illustrating a semiconductor package connected to a circuit substrate in accordance with some embodiments of the disclosure.

FIG. 1J is a schematic cross-sectional view illustrating a semiconductor package 20 connected to a circuit substrate 600 in accordance with some embodiments of the disclosure. The semiconductor package 20 may be similar to the semiconductor package 10 of FIG. 1H, and the same or similar reference numerals are used to indicate the same or similar parts or components. In some embodiments, the circuit substrate 600 may be a semiconductor interposer, a mother board, a printed circuit board, or the like. The semiconductor package 20 is connected to conductive pads 602 of the circuit substrate 600 via the conductive pillars 512 and the solder bumps 522. In some embodiments, the solder cover 524 may contact the circuit substrate 600 without establishing electrical connection. That is, the solder cover 524 may contact the circuit substrate 600 in a region where no conductive pads are formed or exposed. However, the disclosure is not limited thereto. In some alternative embodiments, the solder cover 524 may also be used to interconnect the semiconductor package 10 with conductive pads 602 of the circuit substrate 600. A difference between the semiconductor package 20 of FIG. 1J and the semiconductor package 10 of FIG. 1H lies in the removal of the die attach film DAF (shown in FIG. 1H) from the backside surfaces 100b of the semiconductor dies 100. In some embodiments, the backside surface 100b may be at a substantially same level height as an edge of the encapsulant 202. In some embodiments, additional components (e.g. a heat dissipation system 700 such as a heat spreader) may be disposed on the backside surfaces 100b of the semiconductor dies 100.

Figure 1K:
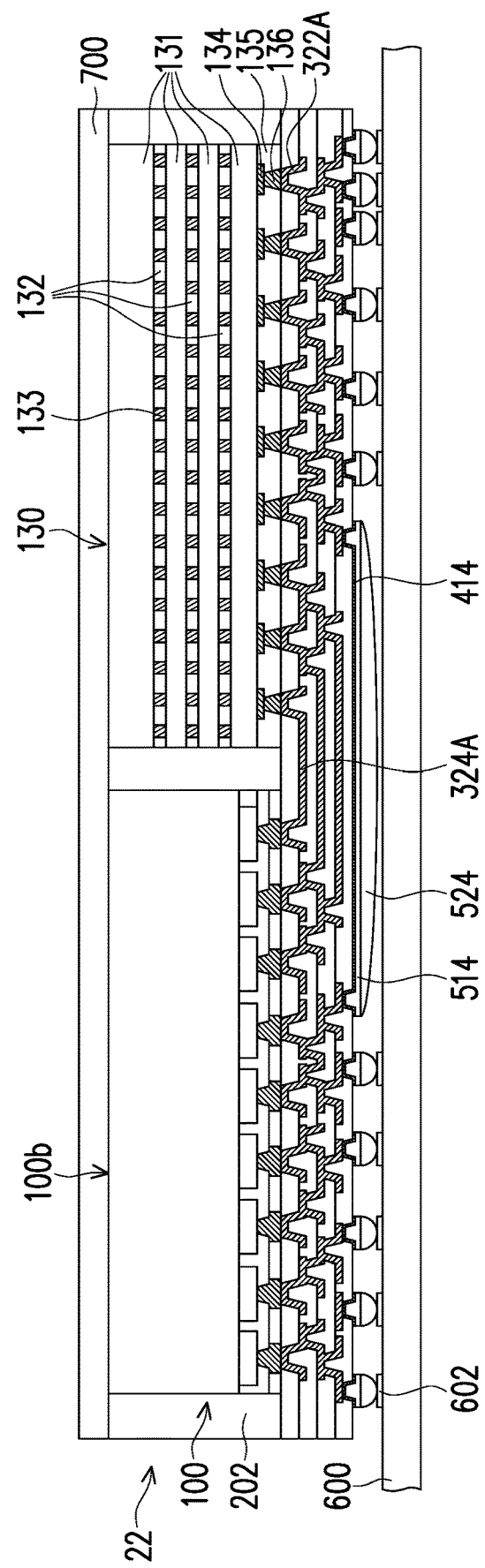

FIG. 1K is a schematic cross-sectional view illustrating a semiconductor package 22 connected to a circuit substrate 600 in accordance with some embodiments of the disclosure. The semiconductor package 22 may be similar to the semiconductor package 20 of FIG. 1J, and the same or similar reference numerals are used to indicate the same or similar parts or components. In some embodiment, the semiconductor package 22 of FIG. 1K includes a chip stack 130 as one of the semiconductor dies. In some embodiments, the chip stack 130 includes multiple chips 131 alternately stacked with passivation material layers 132 and electrically interconnected by conductive vias 133. The base chip 131 (the chip 131 closest to the redistribution structure 300) has conductive pads 134 formed on an active surface facing the redistribution structure 300. A passivation layer 135 covers the active surface of the base chip 131, and exposes portions of the conductive pads 134 through a plurality of openings. Conductive posts 136 fill the openings of the passivation layer 135. Some of the conductive posts 136 are connected to the redistribution patterns 322A and some other conductive posts 136 are connected to the interconnection patterns 324A.

Figure 2A:
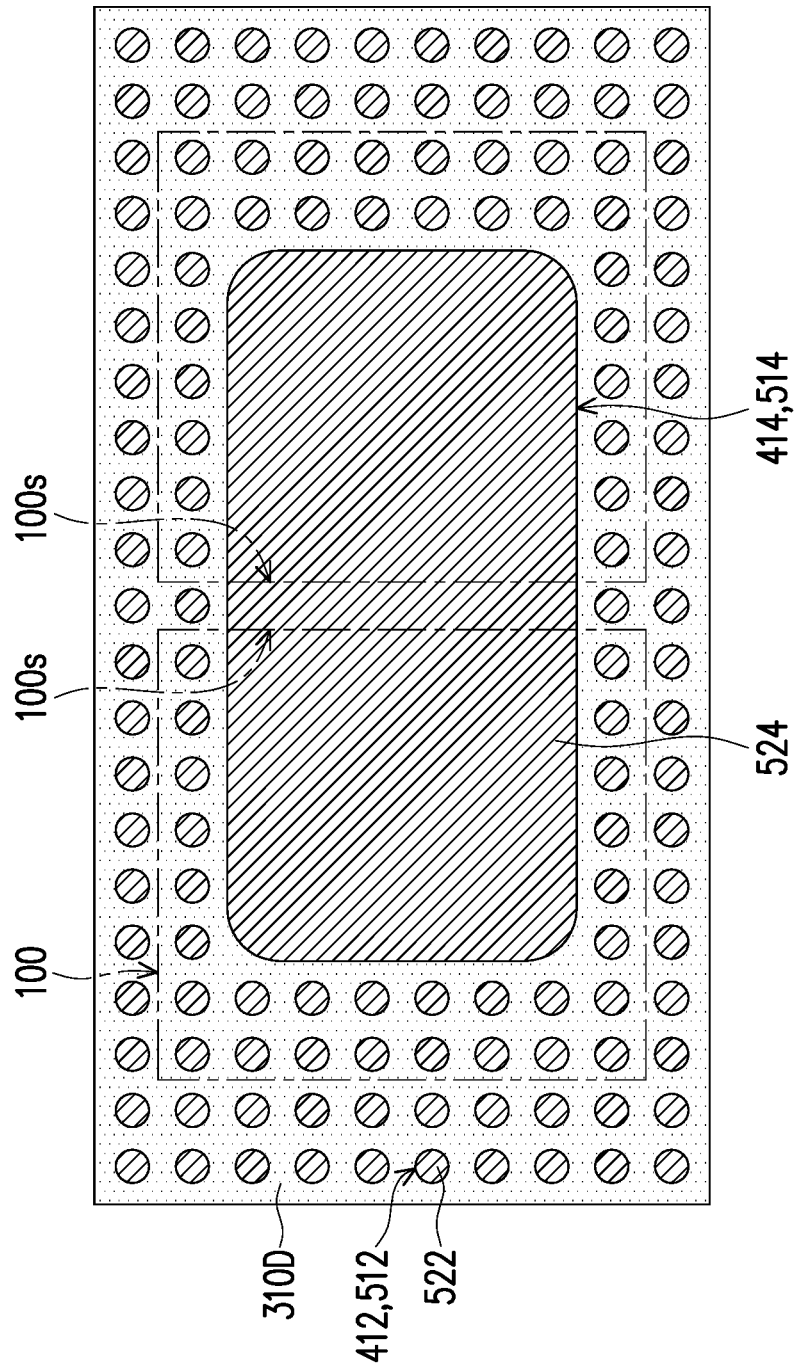
FIG. 2A to FIG. 2C are bottom views of semiconductor packages in accordance with some embodiments of the disclosure.
Figure 2B:
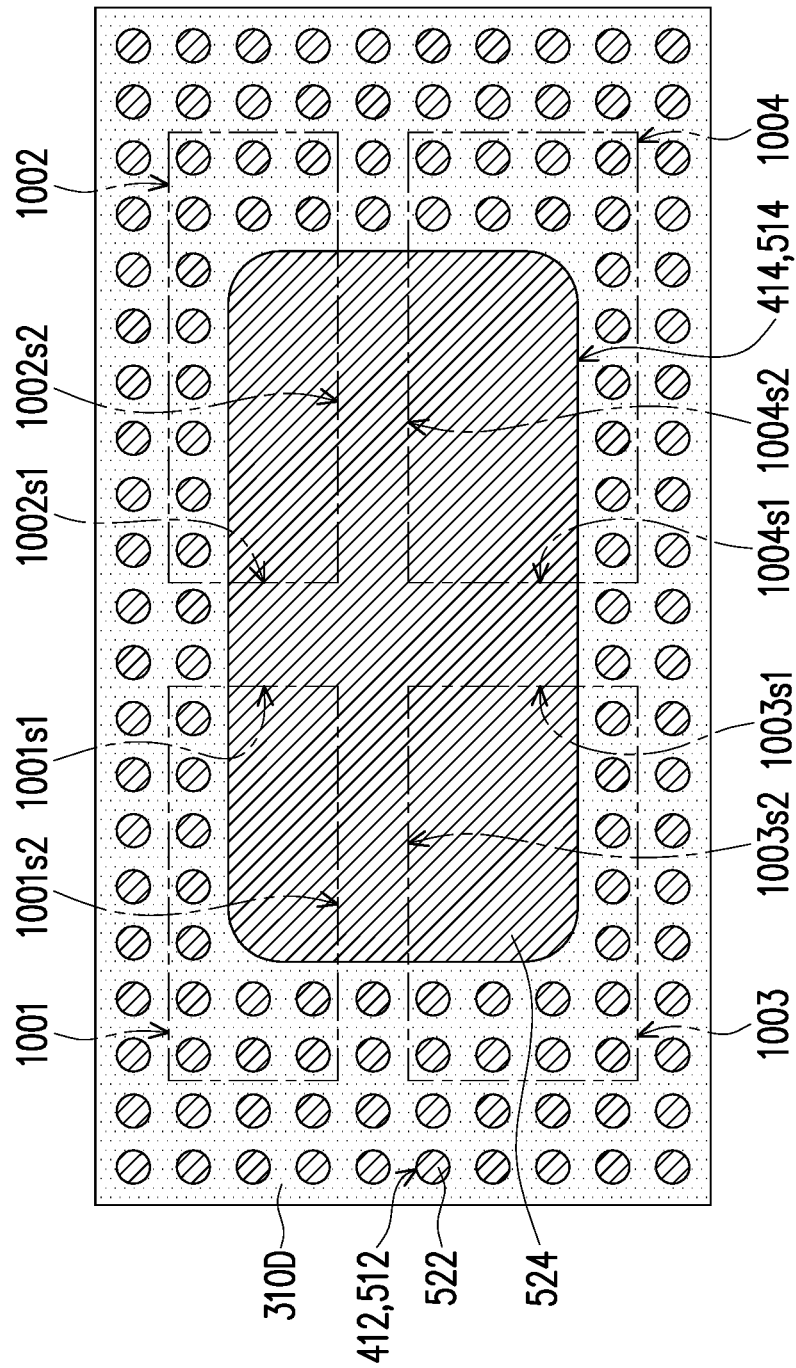
Figure 2C:
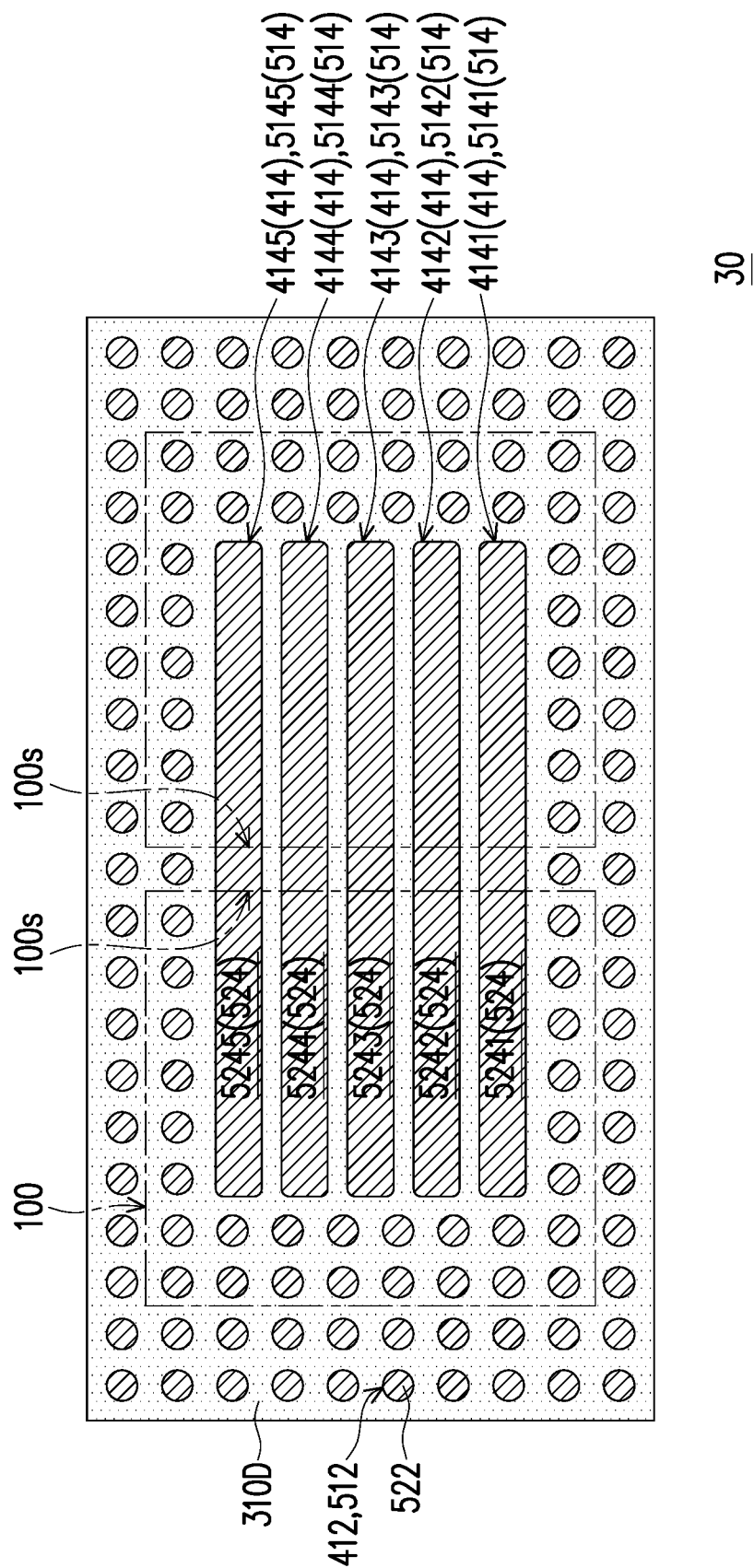

FIG. 2A to FIG. 2C are schematic bottom views of semiconductor packages according to some embodiments of the disclosure. In FIG. 2A through FIG. 2C, the topmost dielectric layer 310D, the solder bumps 522 and the solder cover 524 are illustrated, together with the outlines of the spans occupied by the semiconductor dies 100 (shown in chain lines), the under-bump seed layer 412, the seed plate 414, the conductive pillars 512 and the conductive plate 514. The span of a certain element may be considered the outline of the vertical projection of the same element on the top surface (the surface further away from the encapsulant 200 of FIG. 1H) of the topmost dielectric layer 310D. In some embodiments, spans of the under-bump seed layers 412, the conductive pillars 512 and the solder bumps 522 overlap, and substantially correspond in shape and size to each other. In some embodiments, as illustrated in FIG. 2A, spans of the conductive plate 514, the under-plate seed portion 414 and the solder cover 524 also overlap and substantially correspond in shape and size with each other. In some embodiments, the footprint of the conductive plate 514 may have a substantially rectangular shape. In some alternative embodiments, the conductive plate 514 may be formed in other shapes (circular, polygonal, etc.). In some embodiments, the conductive pillars 512 and the overlying solder bumps 522 may surround the conductive plate 514 and the solder cover 524. That is, the conductive plate 514 and the solder cover 524 may be disposed at a central region of the semiconductor package 10, and the conductive pillars 512 and the solder bumps 522 may be disposed in an annular region surrounding the central region. In some embodiments, the span of the conductive plate 514 overlaps at least partially with the spans of the semiconductor dies 100 (shown in chain lines). In some embodiments, each die 100 of a pair of adjacent semiconductor dies 100 has a side surface 100s facing the other die 100 of the die pair, and the conductive plate 514 may be disposed over the facing side surfaces 100s of the die pair(s). That is, the conductive plate 514 may intersect the vertical projections of the facing side surfaces 100s. In some embodiments, a semiconductor package may include multiple semiconductor dies 1001 to 1004 disposed according to an (m×n) array scheme, for example, in two rows of two columns as shown in FIG. 2B for the semiconductor package 25. In these cases, any one semiconductor die (e.g., 1001) may have multiple side surfaces 1001s1 and 1001s2 facing other semiconductor dies (1002 and 1003 in the example of FIG. 2B, respectively). In such cases, the conductive plate 514 may be disposed over the facing side surfaces 1001s1-1004s1, 1001s2-1004s2 of the semiconductor dies 1001-1004 included in the package 25. In some embodiments, the conductive plate 514 may include multiple portions 5141-5145, as illustrated in FIG. 2C for the semiconductor package 30. In some embodiments, the portions 5141-5145 of the conductive plate 514 have an elongated shape, and are disposed parallel to each other with respect to an elongation direction. That is, the conductive plate 514 may be made of multiple strips of conductive material crossing over the facing side surfaces 100s of the semiconductor dies 100. In some embodiments, portions 5141-5145 of the conductive plate 514 have corresponding underlying seed plate portions 4141-4145. The solder cover 524 may optionally be included, having portions 5241-5245 disposed over the portions 5141-5145 of the conductive plate 514. In some embodiments, the seed plate 414, the conductive plate 514 and the solder cover 524 have the same pattern, and the respective patterns are aligned. The pattern of the conductive plate 514 and the solder cover 524 may be selected by adjusting the pattern of the auxiliary mask M1 (shown in FIG. 1D).

Figure 3A:
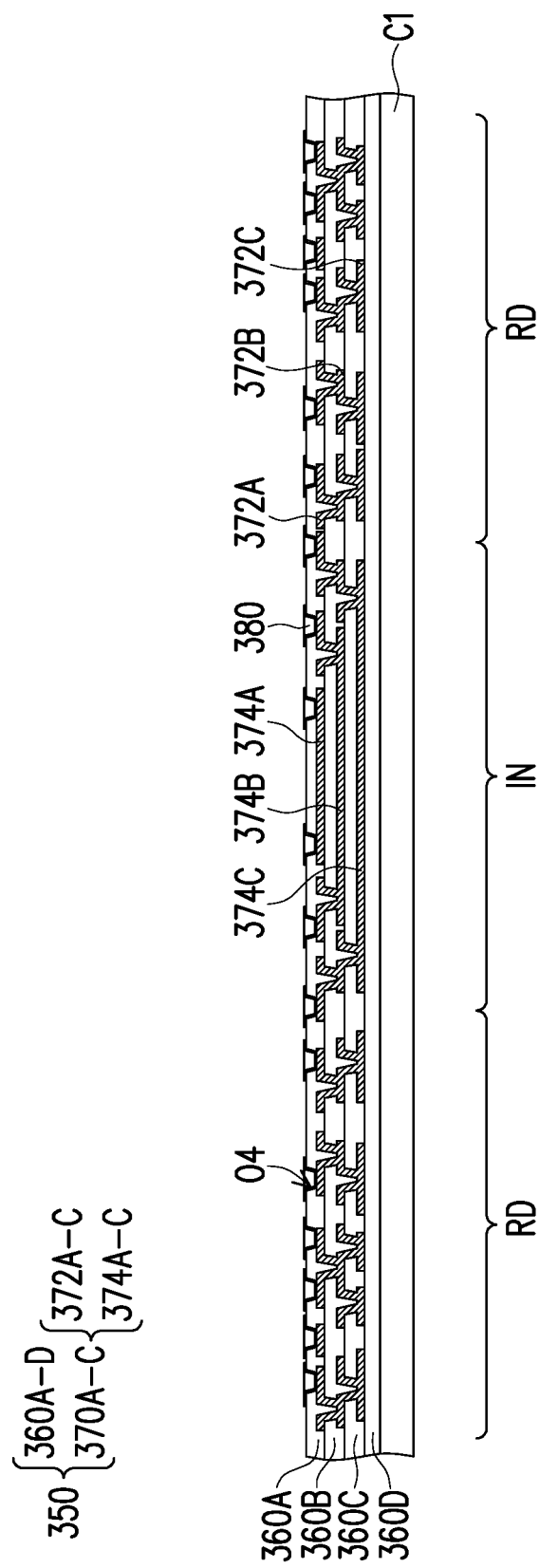
FIG. 3A to FIG. 3D are schematic cross-sectional views illustrating a manufacturing process of a semiconductor package in accordance with some embodiments of the disclosure.

FIG. 3A to FIG. 3D are schematic cross-sectional views illustrating structures produced during a manufacturing process of a semiconductor package 40 (shown in FIG. 3D) in accordance with some embodiments of the disclosure. As shown in FIG. 3A, a redistribution structure 350 is formed over a carrier C1. The redistribution structure 350 includes stacked dielectric layers 360A-D and redistribution conductive layers 370A-C interspersed in the stacked dielectric layers 360A-D. The redistribution conductive layers 370A-C include redistribution patterns 372A-C and interconnection patterns 374A-C. The interconnection patterns 374A-C defines the interconnection region IN of the redistribution structure 350. The redistribution structure 350 may further include a redistribution region RD in which the redistribution patterns 372A-C mostly extend. In some embodiments, the redistribution region RD surrounds the interconnection region IN. In some embodiments, the redistribution structure 350 is formed starting from the outermost layers 360D, 370C and proceeding toward the innermost layers 360A, 370A. For example, the outermost dielectric layer 360D may formed over the carrier C1 before the other dielectric layers 360A-C, and the outermost redistribution conductive layer 370C may be formed on the outermost dielectric layer 360D. In some embodiments, the innermost dielectric layer 360A is formed last, and includes a plurality of openings O4 exposing portions of the innermost redistribution patterns 372A and interconnection patterns 374A. In some embodiments, bonding metallurgies 380 may be formed within the openings O4 of the innermost dielectric layer 360A, including a seed portion conformally disposed within the opening and a bonding pad disposed within the opening O4. In some embodiments, a seed portion may further extend on the dielectric layer 360A around the corresponding opening O4. The bonding metallurgies 380 may be electrically connected to the redistribution conductive layers 370A-C.

Figure 3B:
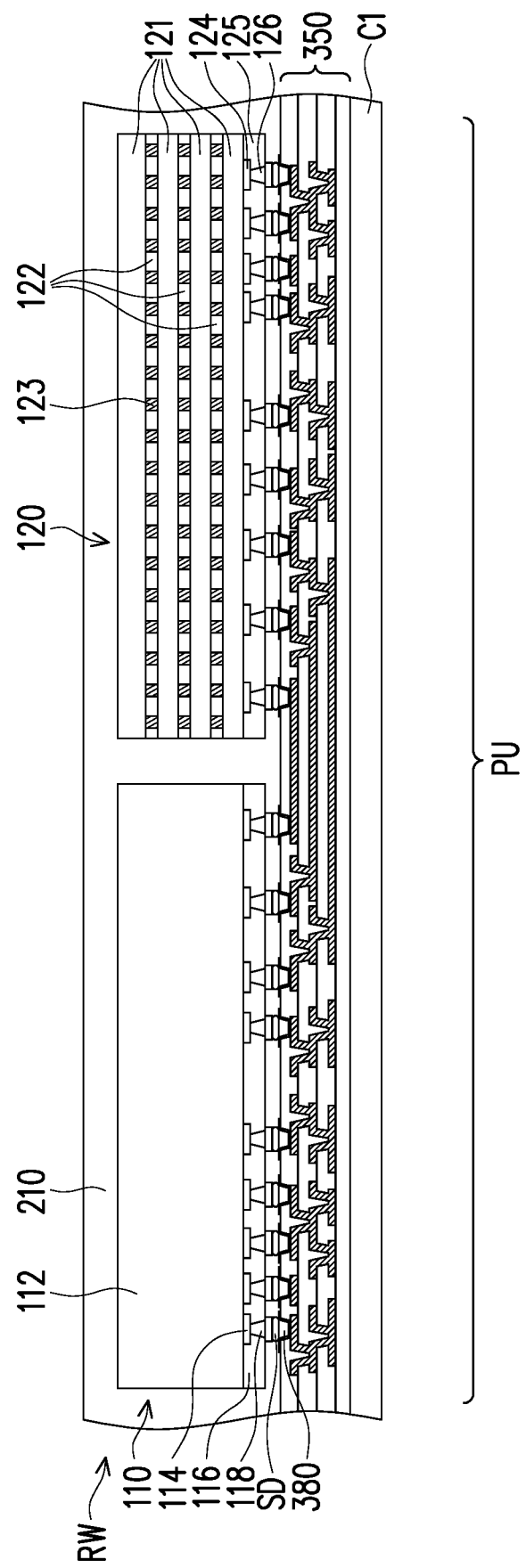

Referring to FIG. 3B, in some embodiments, semiconductor dies 110, 120 are electrically connected to the redistribution structure 360. In some embodiments, the semiconductor die 110 includes similar components as the semiconductor die 100 of the semiconductor package 10 of FIG. 1H, and a detailed description thereof is omitted for brevity sake. Briefly, the semiconductor die 110 may include a semiconductor substrate 112, conductive pads 114 disposed on the semiconductor substrate 112, a passivation layer 116 including openings exposing portions of the conductive pads 114, and conductive posts 118 filling the openings of the passivation layer 116. In some embodiments, the semiconductor die 120 is a chip stack, including multiple chips 121 alternately stacked with passivation material layers 122 and electrically interconnected by conductive vias 123. The base chip 121 (the chip 121 closest to the redistribution structure 350) has conductive pads 124 formed on an active surface facing the redistributions structure 350. A passivation layer 125 covers the active surface of the base chip 121, and exposes portions of the conductive pads 124 through a plurality of openings. Conductive posts 126 fill the openings of the passivation layer 125. In some embodiments, the conductive posts 118, 126 of the semiconductor dies 110, 120 are bonded to the bonding metallurgies 380. In some embodiments, solder material SD is disposed between the conductive posts 118, 126 and the corresponding underlying bonding metallurgy 380. After the semiconductor dies 110, 120 are connected to the redistribution structure 350, an encapsulant 210 is provided, thus forming a reconstructed wafer RW. A single package unit PU is shown in FIG. 3B, however, multiple package units PU may be simultaneously processed at the reconstructed wafer level.

Figure 3C:
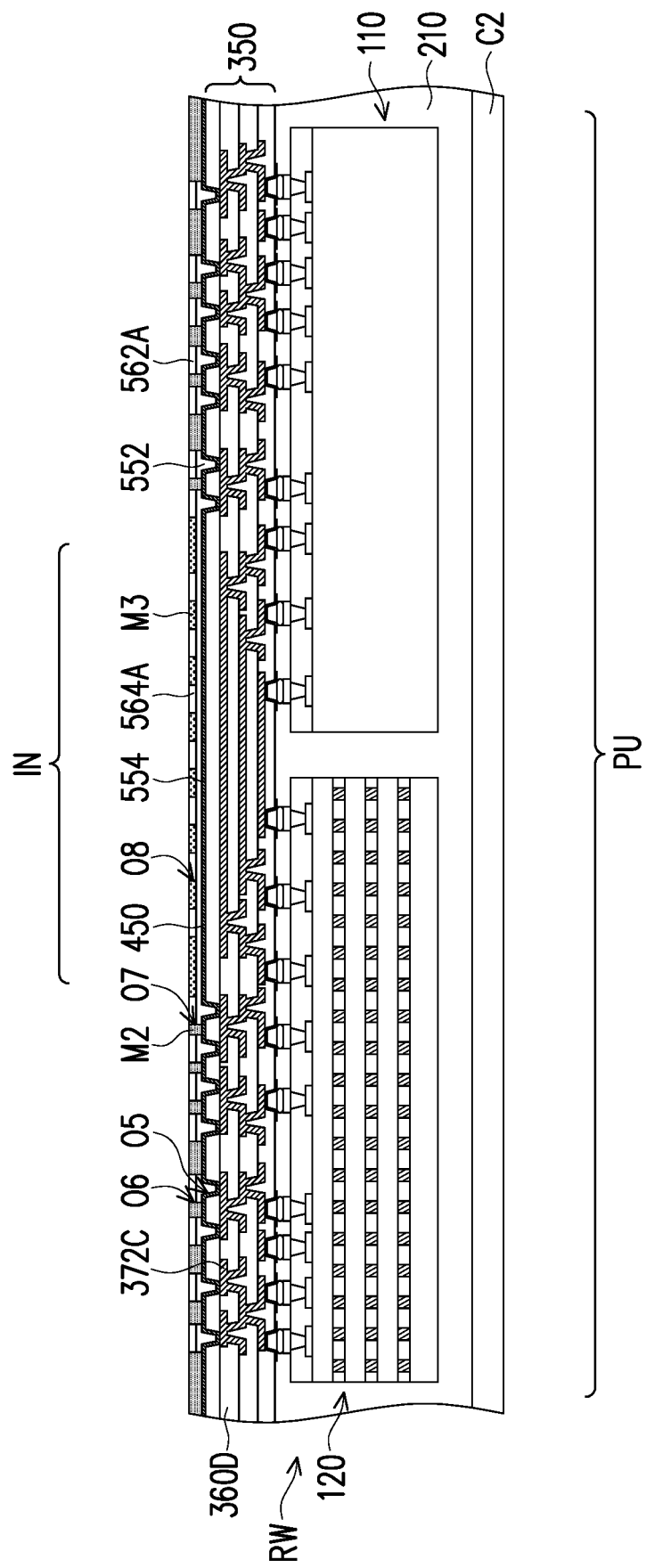

Referring to FIG. 3B and FIG. 3C, a second carrier C2 is bonded to the surface 210a of the encapsulant 210 further away from the redistribution structure 350, and the first carrier C1 is removed, thus exposing the outermost dielectric layer 360D for further processing. Openings O5 are formed in the outermost dielectric layer 360D, exposing portions of the outermost redistribution patterns 372C. A seed material layer 450 and an auxiliary mask M2 are provided similarly to what previously described with reference to FIG. 1D. As shown in FIG. 3C, the auxiliary mask M2 includes openings O6 aligned with the openings O5 of the outermost dielectric layer 360D, and an opening O7 extending in the interconnection region IN. A conductive material is disposed on the seed material layer 450 filling completely the openings O5, and at least partially filling the openings O6 and O7. The conductive material formed in the openings O6 results in conductive pillars 552 similarly to the conductive pillars 512 (shown in FIG. 1H) previously described, while the conductive material formed in the openings O7 results in a conductive plate 554 similar to the conductive plate 514 (shown in FIG. 1H) previously described.

Figure 3D:
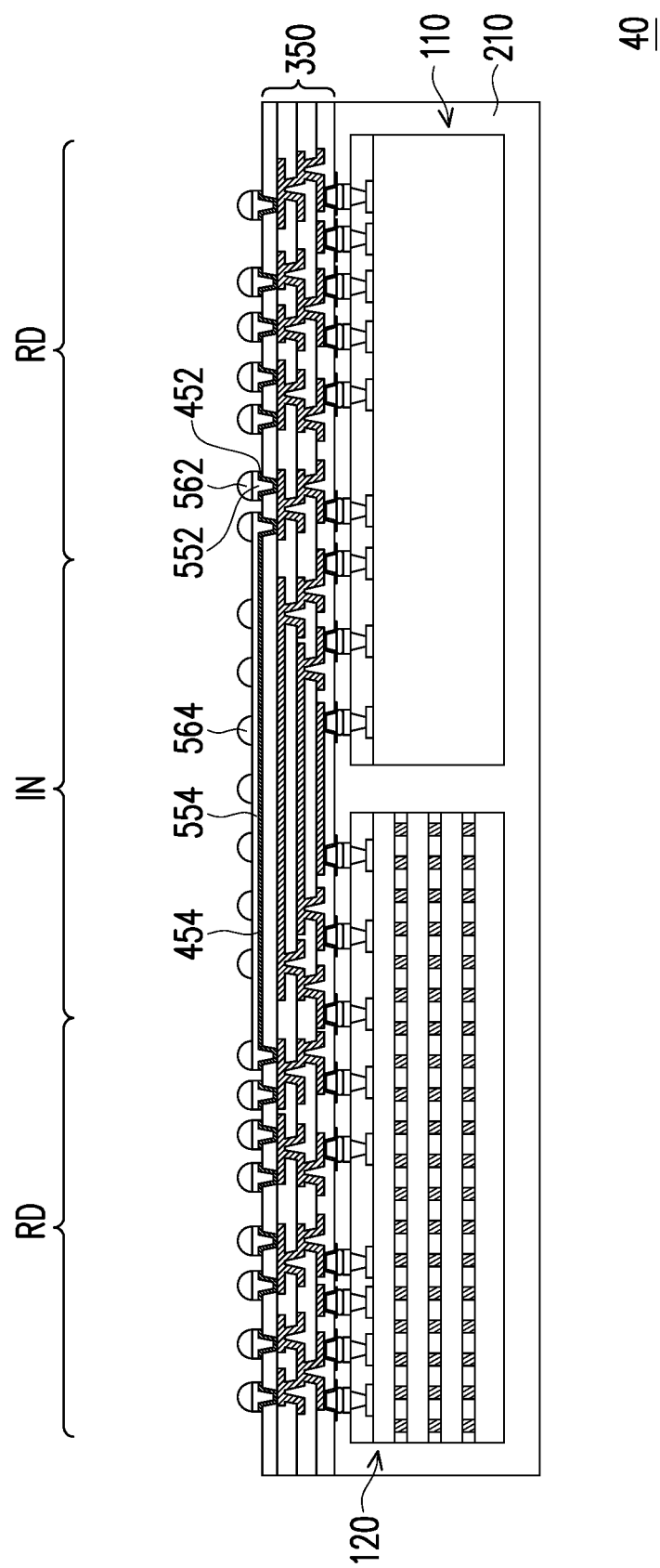

In some embodiments, an auxiliary mask M3 is provided in the openings O7 on the conductive plate 554. The auxiliary mask M3 includes openings O8 exposing portions of the conductive plate 554, and may be formed similarly to what previously described for the auxiliary mask M1 with reference to FIG. 1D. In some alternative embodiments, the auxiliary mask M3 may be a prefabricated stencil. In some embodiments, solder material 562A, 564A may be disposed in the openings O6 and O8 on top of the conductive pillars 552 and the conductive plate 554. Removal of the auxiliary masks M2, M3 and of the portions of seed material layer 450 disposed below the auxiliary mask M2, solder reflow, singulation and debonding of the carrier C2 results in the semiconductor package 40 shown in FIG. 3D. As shown in FIG. 3D, the semiconductor package 40 according to some embodiments of the disclosure includes the semiconductor dies 110, 120 wrapped by the encapsulant 210 and bonded to the redistribution structure 350. Under-bump seed layers 452, conductive pillars 552 and solder bumps 562 are disposed in the redistribution region RD of the redistribution structure 350 and are electrically connected to the semiconductor dies 110, 120. The seed plate 454 and the conductive plate 554 extend on the redistribution structure 350 in the interconnection region IN, and may partially penetrate into the redistribution region RD. In some embodiments, the solder cover 564 is made of multiple solder bumps formed on the conductive plate 554. In some embodiments, the solder bumps 564 may be used to connect the semiconductor package 40 to other devices (not shown).

Figure 4A:
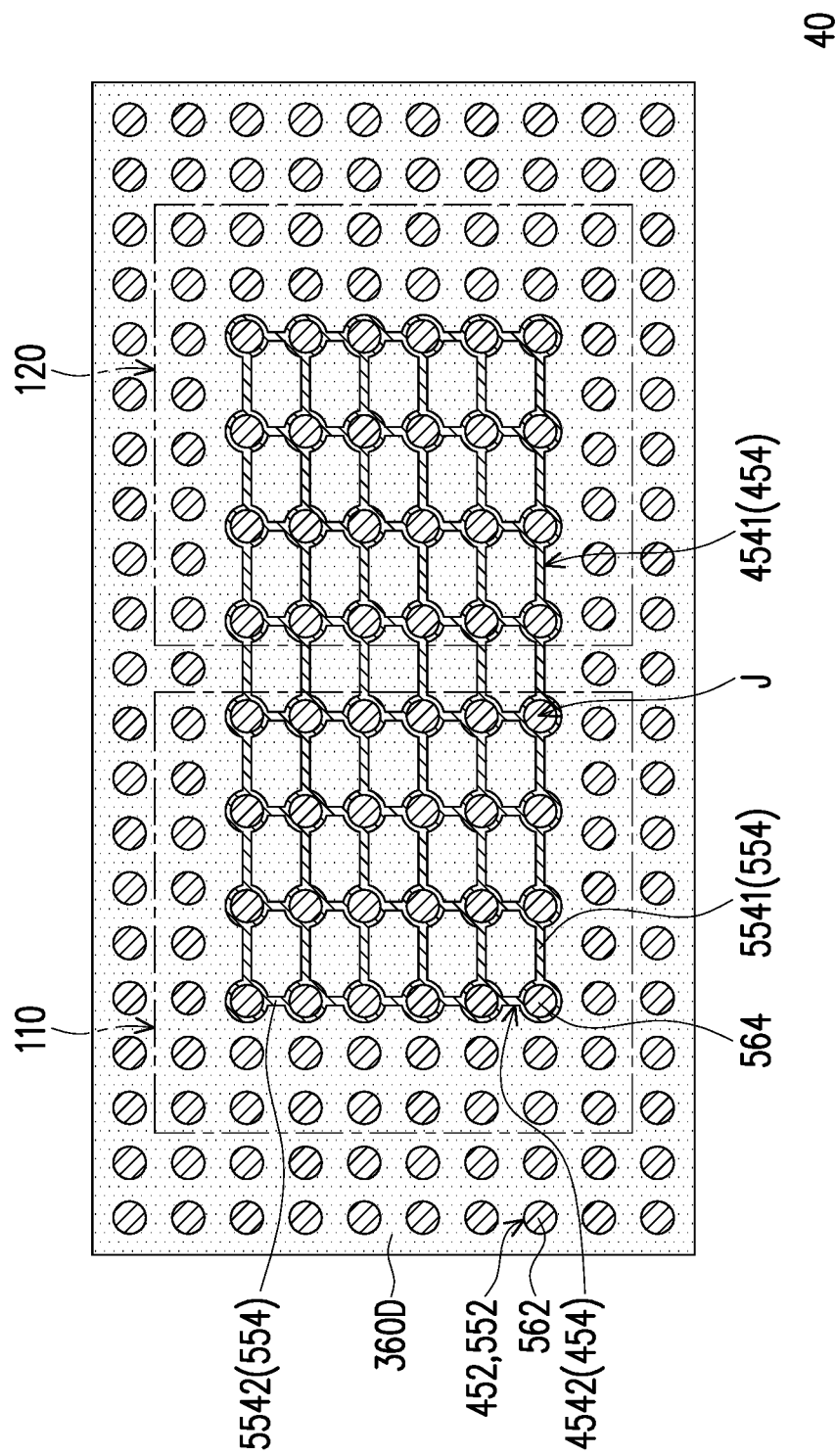
FIG. 4A to FIG. 4B are bottom views of semiconductor packages in accordance with some embodiments of the disclosure.
Figure 4B:
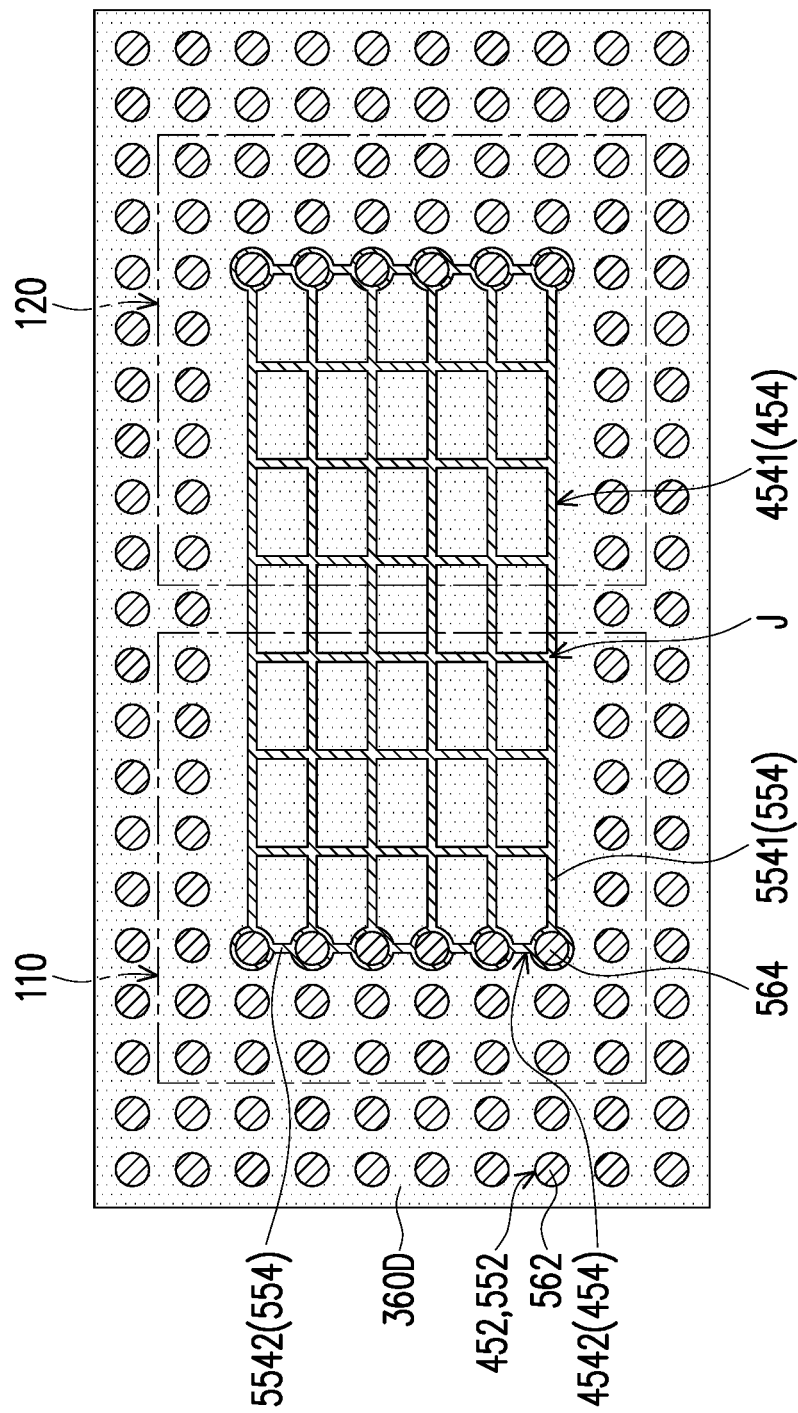

FIG. 4A shows a schematic bottom view of the semiconductor package 40 according to some embodiments of the disclosure. As illustrated in FIG. 4A, in some embodiments, a span of the seed plate 454 and the overlying conductive plate 554 may differ from the span of the solder cover 564. That is, the auxiliary mask M3 of FIG. 3D may be used to impart to the solder cover 564 a different pattern than the underlying conductive plate 554 and the seed plate 454. For example, the conductive plate 554 (and the seed plate 454, if included) may have a reticulated pattern, including first sections 5541 extending in a first direction and second sections 5542 extending in a second direction and intersecting the first sections 5541. In some embodiments, the first sections 5541 and the second sections 5542 form a grid when viewed from the bottom (the point of view of FIG. 4A). The bumps constituting the solder cover 564 may be disposed at the junctions J of the first sections 5541 and the second sections 5542. The junctions J in which the bumps of the solder cover 564 are disposed may be substantially thicker than the adjacent sections 5541 and 5542 (the sections 5541 and 5542 forming the junction J). In some embodiments, the junctions J in which the bumps of the solder cover 564 are disposed have a rounded shape in which the sections 5541 and 5542 converge. In some embodiments, the seed plate 454 includes first sections 4541 and second sections 4542 respectively underlying the first sections 5541 and the second sections 5542 of the conductive plate 554. In some embodiments, the pattern of the seed plate 454 matches the pattern of the conductive plate 554. In some embodiments, the first direction may be perpendicular to the second direction, and the first sections 5541 and the second sections 5542 may intersect describing right angles. In some embodiments, the bumps constituting the solder cover 564 fall within the span of one of the semiconductor dies 110, 120 (shown in chain line). In some embodiments, there is a bump of the solder cover 564 at every junction J. In some alternative embodiments, the bumps constituting the solder cover 564 are disposed at the junctions J between the outermost second sections 5542 and the first sections 5541, leaving the other junction J exposed, as shown for the semiconductor package 50 in FIG. 4B. In some embodiments, a junction J in which no bump of the solder cover 564 is disposed may have comparable thickness with the adjacent sections 5541 and 5542 (the sections forming the junction J).

Figure 5:
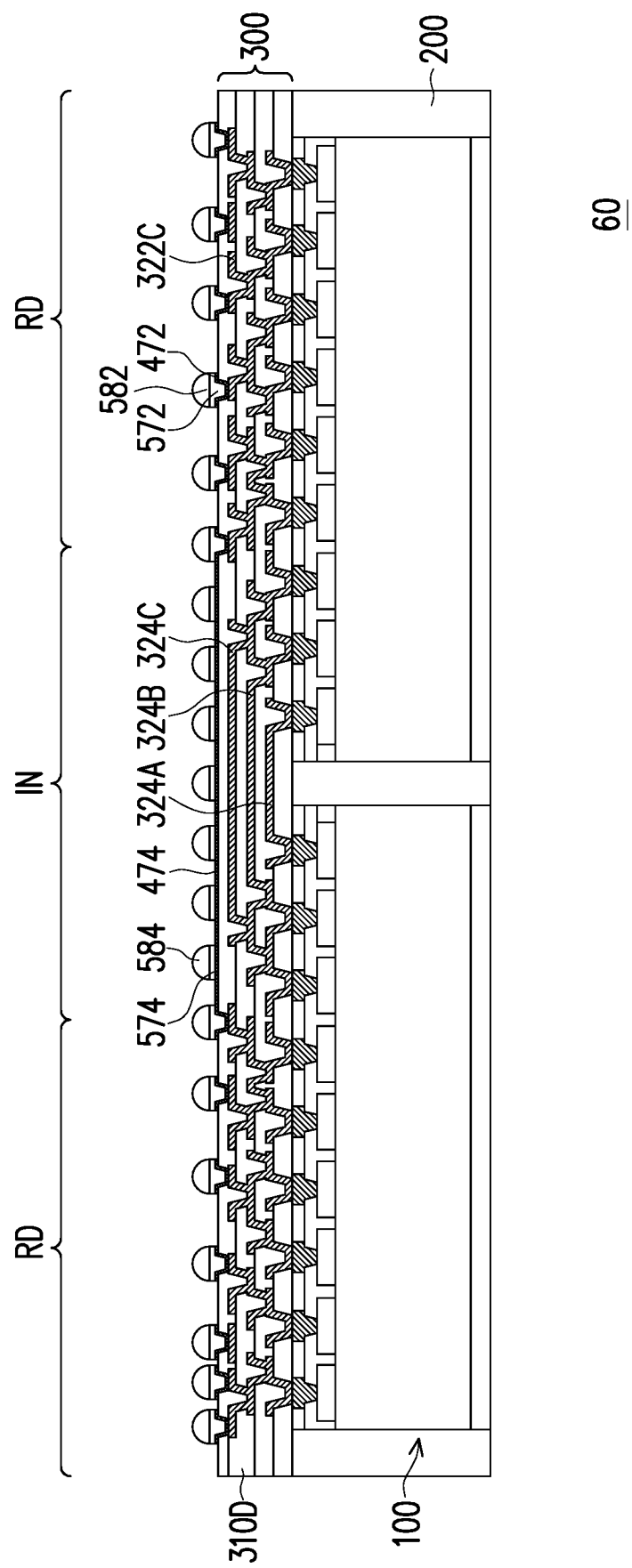
FIG. 5 is a schematic cross-sectional view illustrating a semiconductor package in accordance with some embodiments of the disclosure.
Figure 6:
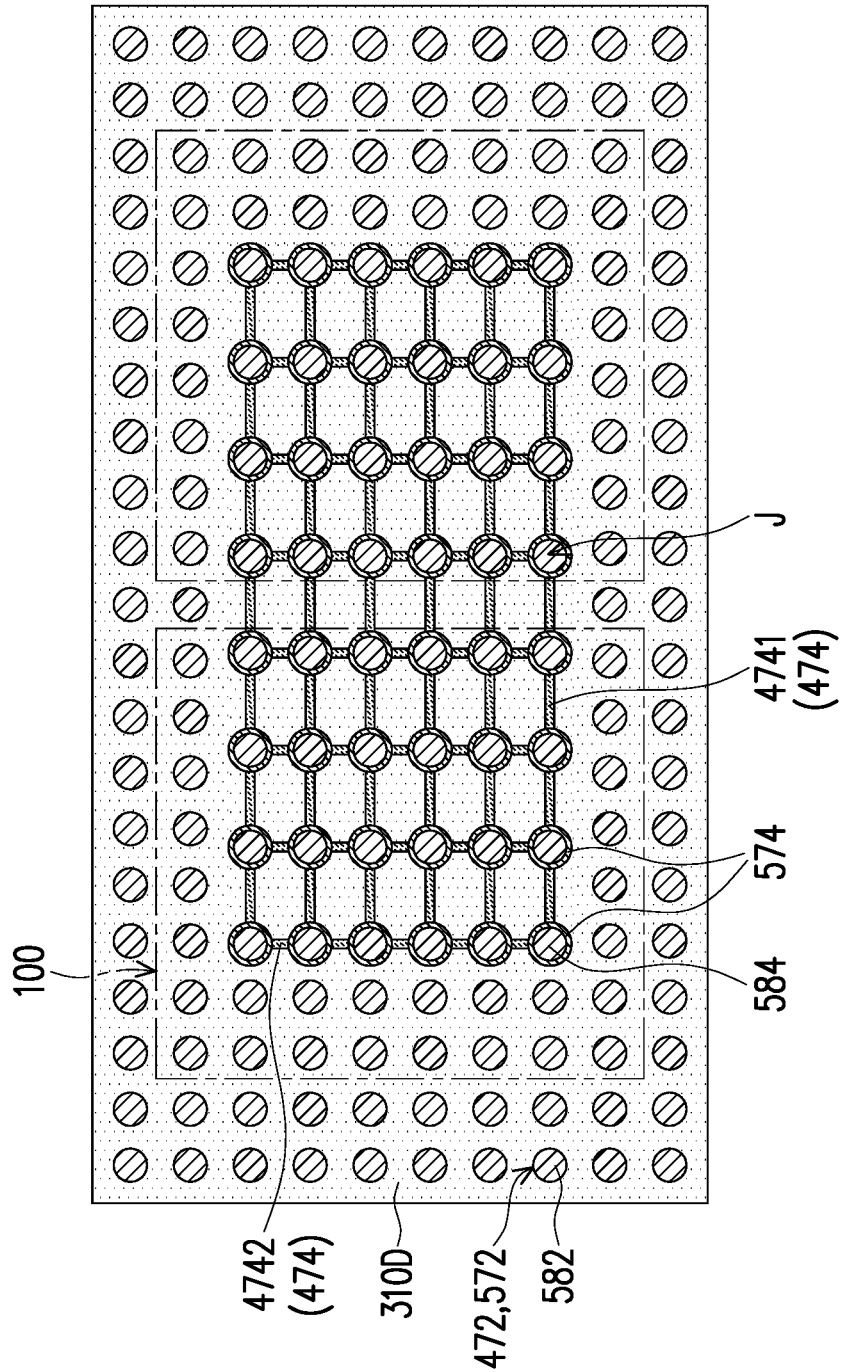
FIG. 6 is a schematic bottom view of a semiconductor package in accordance with some embodiments of the disclosure.

FIG. 5 is a schematic cross-sectional view illustrating a semiconductor package 60 in accordance with some embodiments of the disclosure. FIG. 6 shows a schematic bottom view of the semiconductor package 60 according to some embodiments of the disclosure. The semiconductor package 60 may be similar to the semiconductor package 10 of FIG. 1H, and the same or similar reference numbers are used to describe the same or similar components. Referring simultaneously to FIG. 5 and FIG. 6, in the semiconductor package 60 a span of the seed plate 474 may differ from the span of the overlying conductive plate 574 and solder cover 584. That is, the conductive plate 574 and the solder cover 584 may present a different pattern than the underlying seed plate 474. In some embodiments, the mismatch between the pattern of the conductive plate 474 and the seed plate 474 may result in portions of the seed plate 474 being exposed. For example, the seed plate 474 may have a reticulated pattern, including first sections 4741 extending in a first direction and second sections 4742 extending in a second direction and intersecting the first sections 4741, similarly to what described with reference to FIG. 4A and FIG. 4B. In some embodiments, the first direction may be perpendicular to the second direction, and the first sections 4741 and the second sections 4742 may intersect describing right angles. The solder cover 584 and the conductive plate 574 may both be constituted by multiple portions disposed at the junctions J of the first sections 4741 and the second sections 4742 of the seed plate 474. In some embodiments, the conductive plate 574 is constituted by multiple conductive pillars, and the solder cover 584 by multiple solder bumps. In some embodiments, the bumps of the solder cover 584 and the pillars of the conductive plate 574 fall within the span of one of the semiconductor dies 100 (shown in chain lines). In some embodiments, the conductive pillars of the conductive plate 574 may be partially exposed along the edges of the bumps of the solder cover 584 when viewed from the bottom (as in FIG. 6). However, the disclosure is not limited thereto. In some alternative embodiments, the bumps of the solder cover 584 fully cover the conductive pillars of the conductive plate 574.

Based on the above, a semiconductor package may include semiconductor dies wrapped by an encapsulant and interconnected by a redistribution structure. A conductive plate may be disposed on an outer surface of the redistribution structure opposite to the encapsulant. The conductive plate may optionally have a seed plate disposed underneath, and a solder plate disposed on top. In some embodiments, the conductive plate may improve the connection between the semiconductor dies of the package. In some embodiments, the conductive plate may act as a ground plane for the redistribution structure. In some embodiments, the conductive plate may act as a power feed for the semiconductor package. In some embodiments, the conductive plate can be manufactured together with connectors, without significant increase in process complexity. Therefore, the reliability of the semiconductor package may be improved while containing the unitary production cost. In some embodiments, the conductive plate and the overlying solder may be used to further integrate the semiconductor package within larger devices.

In accordance with some embodiments of the disclosure, a semiconductor package includes dies, a redistribution structure, a conductive structure and connectors. The dies are disposed side by side. Each die includes a contact pad. The redistribution structure is disposed on the dies and electrically connects the dies. The conductive structure is electrically connected to the contact pads of at least two dies and is disposed on the redistribution structure. The conductive structure extends over the at least two dies. The conductive structure includes a conductive plate. The connectors are disposed on the redistribution structure, and at least one connector includes a conductive pillar. The conductive plate is at a same level height as the conductive pillar. A vertical projection of the conductive plate falls on spans of the at least two dies.

In accordance with some embodiments of the disclosure, a semiconductor package includes a redistribution structure, a conductive structure, connectors and semiconductor dies. The semiconductor dies are encapsulated by an encapsulant. The redistribution structure is disposed on the encapsulant and over the semiconductor dies. The redistribution structure includes dielectric layers alternately stacked with redistribution conductive layers. An innermost dielectric layer of the redistribution structure faces the semiconductor dies. The conductive structure is disposed on an outermost dielectric layer of the redistribution structure, and includes a seed plate, a conductive plate, and a solder cover sequentially stacked. The connectors are disposed on the outermost dielectric layer around the conductive structure. The redistribution conductive layers electrically connect the semiconductor dies with each other, with the conductive structure, and with the connectors. A span of the conductive structure is larger than a span of individual connectors. A vertical projection of the conductive structure falls on spans of at least two semiconductor dies of the semiconductor dies.

In accordance with some embodiments of the disclosure, a manufacturing method of a semiconductor package includes at least the following steps. Dies are provided over a carrier. Dielectric layers and redistribution conductive layers are alternately stacked over the carrier to form a redistribution structure. The redistribution conductive layers include interconnection patterns interconnecting the dies and redistribution patterns surrounding the interconnection patterns. An outermost dielectric layer of the dielectric layers is patterned to produce first openings exposing portions of the redistribution patterns. A first auxiliary mask is provided over the redistribution structure. The first auxiliary mask includes second openings aligned with the first openings, and a third opening exposing at least two of the first openings and the outermost dielectric layer extending over the interconnection pattern. The third opening is larger than the second openings. A conductive material is formed in the second openings and the third opening. Solder is formed over the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   dies, disposed side by side, each die including a contact pad;
   a redistribution structure, disposed on the dies and electrically connecting the dies;
   a conductive structure, electrically connected to the contact pads of at least two dies of the dies, disposed on the redistribution structure, and extending over the at least two dies, wherein the conductive structure includes a conductive plate; and
   connectors disposed on the redistribution structure, and at least one connector comprises a conductive pillar,
   wherein the conductive plate is at a same level height as the conductive pillar, and a vertical projection of the conductive plate falls on spans of the at least two dies.

2. The semiconductor package of claim 1, further comprising a solder cover disposed on the conductive plate.

3. The semiconductor package of claim 2, wherein a pattern of the solder cover matches a pattern of the conductive plate.

4. The semiconductor package of claim 1, wherein the conductive plate and the conductive pillar are made of the same material.

5. The semiconductor package of claim 1, wherein the at least one connector further includes an under-bump seed layer and a solder bump, and the under-bump seed layer, the conductive pillar and the solder bump are sequentially stacked.

6. The semiconductor package of claim 1, further comprising a heat dissipation system disposed on backside surfaces of the semiconductor dies.

7. The semiconductor package of claim 1, wherein the conductive plate includes elongated strips extending parallel to each other and extending from over the span of one die of the at least two dies to over the span of the other die of the at least two dies.

8. A semiconductor package, comprising:
   semiconductor dies, encapsulated by an encapsulant;
   a redistribution structure, disposed on the encapsulant and over the semiconductor dies, wherein the redistribution structure includes dielectric layers alternately stacked with redistribution conductive layers, and an innermost dielectric layer of the redistribution structure faces the semiconductor dies;
   a conductive structure disposed on an outermost dielectric layer of the redistribution structure, wherein the conductive structure includes a seed plate, a conductive plate, and a solder cover sequentially stacked; and
   connectors disposed on the outermost dielectric layer and around the conductive structure,
   wherein the redistribution conductive layers electrically connect the semiconductor dies with each other, with the conductive structure, and with the connectors, a span of the conductive structure is larger than a span of individual connectors, and a vertical projection of the conductive structure falls on spans of at least two semiconductor dies of the semiconductor dies.

9. The semiconductor package of claim 8, wherein the seed plate includes first sections extending in a first direction and second sections intersecting the first sections, and the solder cover includes bumps disposed at the intersections of the first sections and the second sections of the seed plate.

10. The semiconductor package of claim 9, wherein the conductive plate includes third sections and fourth sections respectively stacked on the first sections and second sections of the seed plate.

11. The semiconductor package of claim 8, wherein the redistribution conductive layers contact the conductive plate along an edge of the conductive plate.

12. The semiconductor package of claim 8, wherein the conductive structure has a substantially rectangular footprint.

13. The semiconductor package of claim 8, wherein the conductive structure is disposed over at least three semiconductor dies of the semiconductor dies.

14. A manufacturing method of a semiconductor package, comprising:
   providing dies over a carrier;
   alternately stacking dielectric layers and redistribution conductive layers over the carrier to form a redistribution structure, wherein the redistribution conductive layers include interconnection patterns interconnecting the dies and redistribution patterns surrounding the interconnection patterns;
   patterning an outermost dielectric layer of the dielectric layers to produce first openings exposing portions of the redistribution patterns;
   providing a first auxiliary mask over the redistribution structure, wherein the first auxiliary mask includes second openings aligned with the first openings, and a third opening exposing at least two of the first openings and the outermost dielectric layer extending over the interconnection patterns, and the third opening is larger than the second openings;
   forming a conductive material in the second openings and the third opening;
   forming solder over the conductive material; and
   removing the carrier.

15. The manufacturing method of claim 14, wherein forming solder over the conductive material comprises forming solder on the conductive material in the third opening while forming solder on the conductive material in the second openings.

16. The manufacturing method of claim 14, wherein forming solder over the conductive material comprises forming solder on the conductive material in the second openings without forming solder on the conductive material in the third opening.

17. The manufacturing method of claim 14, further comprising;
blanketly forming a seed material layer on the redistribution structure before providing the first auxiliary mask; and
removing the first auxiliary mask and the seed material layer underlying the first auxiliary mask after forming the conductive material, wherein the conductive material in the second openings and the third opening is formed on the seed material layer exposed by the second openings and third opening of the first auxiliary mask.

18. The manufacturing method of claim 17, further comprising providing a second auxiliary mask in the third opening, the second auxiliary mask including fourth openings in which the solder is disposed.

19. The manufacturing method of claim 14, wherein the third opening has a reticulate pattern.

20. The manufacturing method of claim 14, wherein the third opening includes plural independent sub-openings, each sub-opening partially overlapping with at least two of the dies.

* * * * *